United States Patent
Aoki et al.

(10) Patent No.: US 7,554,242 B2
(45) Date of Patent: Jun. 30, 2009

(54) SURFACE ACOUSTIC WAVE CHIP, SURFACE ACOUSTIC WAVE DEVICE, AND MANUFACTURING METHOD FOR IMPLEMENTING THE SAME

(75) Inventors: Shinya Aoki, Minowa-machi (JP); Kazuhiko Akahane, Tatsuno-machi (JP); Yoshio Maeda, Fujimi-machi (JP)

(73) Assignee: Seiko Epson Corporation (JP)

( * ) Notice: Subject to any disclaimer, the term of this patent is extended or adjusted under 35 U.S.C. 154(b) by 493 days.

(21) Appl. No.: 11/332,864

(22) Filed: Jan. 16, 2006

(65) Prior Publication Data

US 2006/0158062 A1   Jul. 20, 2006

(30) Foreign Application Priority Data

Jan. 17, 2005 (JP) ............................. 2005-009130
Feb. 15, 2005 (JP) ............................. 2005-037291
Sep. 14, 2005 (JP) ............................. 2005-266718

(51) Int. Cl.
*H03H 9/145* (2006.01)
*H01L 23/00* (2006.01)
*H01L 41/08* (2006.01)

(52) U.S. Cl. .............................. 310/313 B; 310/313 D; 333/195

(58) Field of Classification Search ................ 310/313; 333/189–195
See application file for complete search history.

(56) References Cited

U.S. PATENT DOCUMENTS 5,838,217 A * 11/1998 Kadota et al. ............... 333/193
5,977,686 A * 11/1999 Kadota et al. ............... 310/313 B
6,018,211 A    1/2000 Kanaboshi et al.
6,337,531 B1 * 1/2002 Nakahata et al. ........ 310/313 R
2004/0178858 A1  9/2004 Miyazaki

FOREIGN PATENT DOCUMENTS

| JP | 03-104409 | | 1/1991 |
|---|---|---|---|
| JP | 07-115343 | | 5/1995 |
| JP | 8-018387 | | 1/1996 |
| JP | 08-018390 | | 1/1996 |
| JP | 08-213874 | | 8/1996 |
| JP | 09199966 A | * | 7/1997 |
| JP | 11-103228 | | 4/1999 |
| JP | 2000-278081 | | 10/2000 |
| JP | 2001-094388 | | 4/2001 |
| JP | 2003-110391 | | 4/2003 |
| JP | 2003-174107 | | 6/2003 |
| JP | 2003-258600 | | 9/2003 |

OTHER PUBLICATIONS

Communication from European Patent Office regarding counterpart application.

* cited by examiner

*Primary Examiner*—Jaydi SanMartin
(74) *Attorney, Agent, or Firm*—Harness, Dickey & Pierce, P.L.C.

(57) ABSTRACT

A surface acoustic wave chip formed with an inter-digital transducer entirely over a piezoelectric substrate. In the surface acoustic wave chip, the inter-digital transducer is extended to a rim of the piezoelectric substrate, and a partition section is provided all the way to the rim of the piezoelectric substrate to partition an electrode pattern to derive two of the inter-digital transducers.

9 Claims, 18 Drawing Sheets

US 7,554,242 B2

SURFACE ACOUSTIC WAVE CHIP, SURFACE ACOUSTIC WAVE DEVICE, AND MANUFACTURING METHOD FOR IMPLEMENTING THE SAME

RELATED APPLICATIONS

This application claims priority to Japanese Patent Application Nos. 2005-009130 filed Jan. 17, 2005, 2005-037291 filed Feb. 15, 2005 and 2005-266718 filed Sep. 14, 2005.

BACKGROUND

1. Technical Field

The present invention relates to a surface acoustic wave chip formed with an inter-digital transducer that performs conversion between electric signals and surface acoustic waves, a surface acoustic wave device, and a manufacturing method for implementing the device.

2. Related Art

In electronic and communications components such as mobile phones and television receivers, surface acoustic wave devices (hereinafter, referred to as "SAW devices") serve as a resonator, band-pass filter, or the like. In such SAW devices, connections are established through wire bonding or bumping with components housed in the package, e.g., a surface acoustic chip, and a circuit board.

FIGS. 27A and 27B are diagrams showing an example of a known SAW device. Specifically, FIG. 27A is a cross sectional view of the SAW device, and FIG. 27B is a cross sectional view along a line A-A of FIG. 27A. For details of such a SAW device, refer to Patent Document 1 (JP-A-2003-1.10391).

In the drawings, a SAW device 1 is configured so that a pair of inter-digital transducers or comb electrodes (hereinafter, referred to as IDTS) 3 are formed entirely over a piezoelectric substrate 2 that is made of crystal or the like, and are sealed with a cover 9 via a cavity 4. Here, the cover 9 is a glass substrate.

As shown in FIG. 27B, the IDTs 3 each include a terminal 5 on the piezoelectric substrate 2, and as shown in FIG. 27A, a connection is established with an external electrode 8 using a conductive through hole 7.

For attachment of the cover 9 to the piezoelectric substrate 2, an electrode pattern 6 is formed to the edge portions of the piezoelectric substrate 2 along its rim.

With a configuration such, through anode attachment, the glass cover 9 is securely sealed against the piezoelectric substrate 2 at its rim edge portions.

Another example of a previously-known SAW device takes a configuration such as shown in FIG. 28, which shows the simplified manufacturing process of FIG. 2 of Patent Document 2 (JP-A-8-213874), for example.

To be more specific, in FIG. 28, a reference numeral 1 denotes a wafer made of a piezoelectric material such as crystal. As shown in the drawing, from one piece of wafer 1, a plurality of surface acoustic wave chips 2 are simultaneously formed for use in forming surface acoustic devices.

Each surface acoustic wave chip 2 is formed with inter-digital transducers or comb electrodes (IDT electrodes) 3a and 3b that are entirely over a substrate configured by the wafer 1. The IDT electrodes 3a and 3b are made of an aluminum pattern or the like. The surface acoustic wave device seals therein the surface acoustic wave chips 2 with a glass substrate serving as a cover (not shown).

As shown in FIG. 28, the wafer 1 is entirely formed with a metallic layer 5, e.g., an aluminum layer, and thereon, the surface acoustic wave chips 2 are formed by photolithography or the like. That is, the IDT electrodes 3a and 3b provided to the surface acoustic wave chip 2 are formed so as to oppose each other so that their electrode fingers dig into each other.

FIGS. 29A and 29B both show still another example of a previously-known SAW device, which is shown in FIG. 4 of Patent Document 3 (JP-A-2001-94388), for example. Specifically, FIG. 29A is a cross sectional view of the SAW device in the longitudinal direction, and FIG. 29B is an enlarged view of select portions of FIG. 29A. The SAW device has a configuration such that an aluminum extractor electrode 80 is formed on a piezoelectric substrate 32. The piezoelectric substrate 32 also carries thereon an inter-digital transducer (IDT), a reflector (not shown), or the like. An aperture section 81 carries therein a conductive embedding member 82, and is heated in a vacuum so that a connection is established between the extractor electrode 80 and an external electrode 83, thereby attempting to suppress the effects of connection resistance due to alumina occurring on the surface of the extractor electrode 80. In view thereof, unlike the invention, there are no characteristics in the configuration of an IDT or the like.

In the previously-known configuration of FIGS. 27A and 27B, the terminal 5 of the IDT 3 is provided on the piezoelectric substrate 2, and for electric insulation from the terminal 5, the electrode pattern 6 is provided for attachment at a position away therefrom on the plane.

As a first problem, the piezoelectric substrate 2 is required to be large relative to the size of the IDT 3. This impairs space efficiency, resultantly causing a difficulty of downsizing the SAW device 1.

With the previously-known manufacturing method of FIG. 28, in the process of electrode formation, in the IDTs provided in a pair, there needs to be a no-electrode-layer portion 4 formed around the IDT electrodes 3a and 3b to make them separate from each other.

The IDT electrodes 3a and 3b are each preferably formed with an oxidation layer on their surfaces for protection purpose mainly due to the necessity of preventing the risk of a short circuit therebetween. When the IDT electrodes 3a and 3b are of aluminum electrodes, in view of production efficiency, it is considered preferable that every IDT electrode is formed with a protection layer on the surface through anode attachment over the wafer 1.

As a second problem, as shown in FIG. 28, it is difficult to form such a protection layer all at once over the surface of every IDT electrode due to the configuration wherein the IDT electrodes 3a and 3b are provided so as to be away from each other on the wafer 1.

SUMMARY

An advantage of some aspects of the invention is to solve the first problem, and provide a surface acoustic wave chip and device suitable for size reduction in view of configuration, and a manufacturing method for implementing the device.

Another advantage of some aspects of the invention is to solve the second problem, and to provide a surface acoustic wave device of a configuration capable of increasing the manufacturing process efficiency of a protection layer, and a manufacturing method for implementing the device.

A first aspect of the invention is directed to a surface acoustic wave chip formed with an inter-digital transducer entirely over a piezoelectric substrate. In the surface acoustic wave chip, the inter-digital transducer is extended to the rim of the piezoelectric substrate, and a partition section is provided all the way to the rim of the piezoelectric substrate to partition the electrode pattern to derive two of the inter-digital transducers.

In the first aspect, since an inter-digital transducer, i.e., IDT, is extended all the way to the rim of a piezoelectric substrate, the surface of the piezoelectric substrate can be effectively used for IDT formation. That is, the piezoelectric substrate needed for IDT formation is reduced in size so that the resulting surface acoustic wave chip can be favorably downsized. For this purpose, the piezoelectric substrate is formed with a partition section on the rim for partitioning the extended IDT to derive two electrodes. This partition section is pulled out to the outside, and can be used similarly as any previously-known IDT terminal, for example.

A second aspect of the invention is directed to a surface acoustic wave device in which a cover seals over a surface acoustic wave chip having a piezoelectric substrate formed thereon with an inter-digital transducer. In the surface acoustic wave device, the inter-digital transducer is extended to the rim of the piezoelectric substrate, a partition section is provided all the way to the rim of the piezoelectric substrate to partition the electrode pattern to derive two of the inter-digital transducers, a sealing region is provided for anode attachment along the outer edge of the sealing surface of the cover, and a concave section is formed to the outer edge of the cover for sealing at a position corresponding to the partition section on the piezoelectric substrate.

In the second aspect, in the same principles as the first aspect, a surface acoustic wave chip can be reduced in size. What is more, for the surface acoustic wave chip in such a configuration, a cover and a piezoelectric substrate for sealing the chip are attached together at outer edge portions through anode attachment. To a sealing region of the cover, a concave section is formed at the position corresponding to a partition section on the piezoelectric substrate for attachment. With the resulting concave section, continuity is first established between the internal electrode pattern and the external electrode, and then a sealing material is filled into the concave section for sealing.

As such, according to the second aspect, a small-sized SAW device can be implemented through effective area use of the piezoelectric substrate.

According to a third aspect, in the second aspect, the sealing region of the cover is formed with a glass for anode attachment.

In the third aspect, the sealing region of the cover is formed in advance with a glass for anode attachment. This enables anode attachment, and implements with certainty the sealing configuration with ease.

According to a fourth aspect, in the second or third aspect, with the cover attached to the piezoelectric substrate, the electrode pattern on the piezoelectric substrate is partially exposed from the concave section.

In the fourth aspect, the electrode pattern exposed from the concave section can be used as a terminal for connection with an external electrode or the like.

According to a fifth aspect, in the fourth aspect, the sealing surface of the cover is entirely formed with a glass for anode attachment except a region formed on the piezoelectric substrate with electrodes such as the inter-digital transducer.

In the fifth aspect, the attachment area is increased so that the attachment configuration can be implemented with certainty.

According to a sixth aspect, in any one of the second, third, and fifth aspects, a through hole formed as an alternative to the concave section in the cover at the position corresponding to the partition section on the piezoelectric substrate is conductive for establishing an electrical connection with an external electrode to be formed on the surface side.

In the sixth aspect, for connection of an external electrode to the cover surface, for example, the external electrode is formed in the vicinity of the aperture section of the through hole so that the configuration for an electrical connection can be implemented with ease.

A seventh aspect of the invention is directed to a surface acoustic wave device manufacturing method that includes: a preprocessing step of individually preparing a piezoelectric substrate including an inter-digital transducer, and a cover that seals the piezoelectric electrode; and sealing the piezoelectric substrate through attachment of the cover thereto. In the manufacturing method, in the preprocessing step, the inter-digital transducer is extended over the piezoelectric substrate all the way to the rim thereof, a partition section is formed all the way to the rim of the piezoelectric substrate to partition an electrode pattern to derive two of the inter-digital transducers, a sealing region is provided for anode attachment along the outer edge of a sealing surface of the cover, and a concave section is formed for sealing at a position of the cover corresponding to the partition section on the piezoelectric substrate. In the sealing step, the cover is attached entirely over the piezoelectric substrate through anode attachment, a connection is established with an electrode pattern on the piezoelectric substrate after an external electrode is formed on the surface side, and the concave section is sealed by an insulation sealing.

In the seventh aspect, the preprocessing can be easily implemented only by changing the area range for electrode provision, or only by processing the cover in advance. Such preprocessing simplifies, in the sealing step, attachment between a cover and a piezoelectric substrate through anode attachment. With this being the case, because the cover is formed with a concave section in the previous processing step so that there is no risk of causing a short circuit between electrodes. What is more, due to IDT formation over the surface of a single piezoelectric substrate, a small-sized SAW device can be manufactured with ease.

According to an eighth aspect, in the seventh aspect, after the cover is attached to the piezoelectric substrate, the electrode pattern on the piezoelectric substrate is partially exposed from the concave section, and in the connection-establishing step, an electrode pattern of the external electrode is routed to the concave section for electrically connecting with the electrode pattern on the piezoelectric substrate.

In the eighth aspect, the electrode pattern exposed from the concave section is used as a terminal for connection with an external electrode or the like so that any needed electrical connection can be implemented with ease.

According to a ninth aspect, in the seventh aspect, as an alternative to the concave section, a through hole is previously formed in the cover at the position corresponding to the partition section on the piezoelectric substrate, and using the through hole as a conductive through hole, in the connection-establishing step, an electrical connection is established between the external electrode and the electrode pattern on the piezoelectric substrate.

In the ninth aspect, for connection of an external electrode to the cover surface, for example, forming an external electrode in the vicinity of an aperture section of the through hole will easily enable connection between the external electrode and the IDT.

A tenth aspect of the invention is directed to a surface acoustic wave device in which a cover seals over a surface acoustic wave chip having a piezoelectric substrate formed thereon with an inter-digital transducer. In the surface acoustic wave device, the inter-digital transducer is extended to the rim of the piezoelectric substrate, and a protection layer formation pattern being at least a part of the resulting extended electrode pattern is formed, a partition section is provided all the way to the rim of the piezoelectric substrate to partition the electrode pattern to derive two of the inter-digital transducers, a sealing region is provided for anode attachment along the outer edge of a sealing surface of the cover, and a concave section is formed to the outer edge of the cover for sealing at the position corresponding to the partition section on the piezoelectric substrate.

In the tenth aspect, since an inter-digital transducer, i.e., an IDT, is extended all the way to the rim of a piezoelectric substrate so that the surface of the piezoelectric substrate can be effectively used for IDT formation. That is, the piezoelectric substrate needed for IDT formation is reduced in size so that the resulting surface acoustic wave chip can be favorably downsized. For this purpose, the piezoelectric substrate is formed with a partition section on the rim for partitioning the extended IDT to derive two electrodes. This partition section is pulled out to the outside, and can be used similarly as any previously-known IDT terminal, for example.

The protection layer formation pattern is at least a part of the electrode pattern of the IDT that is extended all the way to the rim of the piezoelectric substrate. Accordingly, by applying power to a protection layer formation pattern, the IDT can be formed with an anode oxide layer serving as a protection layer. Due to the fact that the protection layer formation pattern is the electrode pattern extended all the way to the rim of the piezoelectric substrate, in the process of forming a plurality of surface acoustic wave chips from a specific substrate material, e.g., a crystal wafer, IDTs of the resulting surface acoustic wave chips made of the substrate material can be formed with the anode oxide layer all at once with ease. Such formation can be achieved by a connection between a metal layer formed to the substrate material and the respective protection layer formation patterns.

According to an eleventh aspect, in the tenth aspect, on a protection layer formed to the electrode pattern on the inter-digital transducer, a metal bump is formed as if to break the protection layer, and through the metal bump, a connection is established with an external electrode formed outside of the device.

In the eleventh aspect, when the protection layer of the IDT cuts off the electrical continuity or increases the electrical resistance, another continuity is established with an external electrode using a metal bump that is provided as if to break the protection layer so that the secure connection can be implemented.

According to a twelfth aspect, in the eleventh aspect, on the protection layer of the electrode pattern exposed from a through hole that is previously formed in the cover, as an alternative to the concave section for sealing, the metal bump is formed as if to break the protection layer.

In the twelfth aspect, for connection of an external electrode on the cover surface, the through hole serves as a conductive through hole, and around its aperture, an external electrode is formed. Such a configuration can ease establishing an electrical connection. With this being the case, by establishing continuity with an external electrode with a metal bump provided as if to break the protection layer, the connection becomes more secure.

According to a thirteenth aspect, in the tenth aspect, an exposing section is provided by not forming the protection layer to a part of the extended electrode pattern, and the exposing section is connected with an external electrode formed outside of the device.

In the thirteenth aspect, an exposing section is formed with no protection layer. Even if the protection layer causes adverse effects for electrical continuity, the exposing section can be thus free from such adverse-effects.

A fourteenth aspect of the invention is directed to a surface acoustic wave device manufacturing method that includes: a substrate-preprocessing step and a cover-preprocessing step of individually preparing a piezoelectric substrate including an inter-digital transducer, and a cover that seals the piezoelectric electrode; and sealing the piezoelectric substrate through attachment of the cover thereto. In the manufacturing method, in the substrate-preprocessing step, the inter-digital transducer is extended over the piezoelectric substrate all the way to a rim thereof, a protection layer formation pattern being at least a part of the resulting extended electrode pattern is formed, a partition section is formed all the way to the rim of the piezoelectric substrate to partition the electrode pattern to derive two of the inter-digital transducers, and using the protection layer formation pattern, an anode oxide layer serving as a protection layer is formed to the electrode pattern configuring the inter-digital transducer. In the cover-preprocessing step, a sealing region is provided for anode attachment along the outer edge of the sealing surface of the cover, and a concave section is formed for sealing at a position of the cover corresponding to the partition section on the piezoelectric substrate. In the sealing step, the cover is attached entirely over the piezoelectric substrate through anode attachment, a connection is established with the electrode pattern on the piezoelectric substrate after an external electrode is formed on the surface side, and the concave section is sealed by an insulation sealing.

In the fourteenth aspect, the preprocessing can be easily implemented only by changing the area range for electrode provision, or only by processing the cover in advance. Such preprocessing simplifies, in the sealing step, attachment between a cover and a piezoelectric substrate through anode attachment. With this being the case, because the cover is formed with the concave section in the previous processing so that there is no risk of causing a short circuit between electrodes. What is more, due to IDT formation over the surface of a single piezoelectric substrate, a small-sized SAW device can be manufactured with ease.

In the substrate-preprocessing step, the protection layer formation pattern is at least a part of the electrode pattern of the IDT that is extended all the way to the rim of the piezoelectric substrate. Accordingly, by applying power to a protection layer formation pattern, the IDT can be formed with an anode oxide layer serving as a protection layer. Due to the fact that the protection layer formation pattern is the electrode pattern extended all the way to the rim of the piezoelectric substrate, in the process of forming a plurality of surface acoustic wave chips from a specific substrate material, e.g., crystal wafer, IDTs of the resulting surface acoustic wave chips made of the substrate material can be formed with the anode oxide layer all at once with ease. Such formation can be achieved by a connection between a metal layer formed to the substrate material and the respective protection layer formation patterns.

According to a fifteenth aspect, in the fourteenth aspect, on the protection layer, a metal bump is formed as if to break the protection layer, and through the metal bump, a connection is established with an external electrode formed outside of the device.

In the fifteenth aspect, when the protection layer of the IDT cuts off the electrical continuity or increases the electrical resistance, another continuity is established with an external electrode using a metal bump that is provided as if to break the protection layer so that the secure connection can be implemented.

According to a sixteenth aspect, in the fifteenth aspect, as an alternative to the concave section, a through hole is previously formed in the cover at the position corresponding to the partition section on the piezoelectric substrate, and the metal bump is formed on the protection layer of the electrode pattern exposed from the through hole, and the through hole is used as a conductive through hole for establishing an electrical connection between the external electrode and the electrode pattern on the piezoelectric substrate.

In the sixteenth aspect, by making the through hole serve as a conductive through hole for connection of an external electrode on the cover surface, an external electrode is formed around the aperture of the through hole. Such a configuration can ease to establish an electrical connection. With this being the case, by establishing continuity with the external electrode with a metal bump provided as if to break the protection layer, the connection becomes more secure.

According to a seventeenth aspect, in the fourteenth aspect, when the protection layer is formed, the extended electrode pattern is partially masked not to be formed thereon with the protection layer, and the resulting exposing section is connected with an external electrode formed outside of the device.

In the seventeenth aspect, an exposing section is formed with no protection layer. Even if the protection layer causes adverse effects for electrical continuity, the exposing section can be thus free from such adverse effects.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
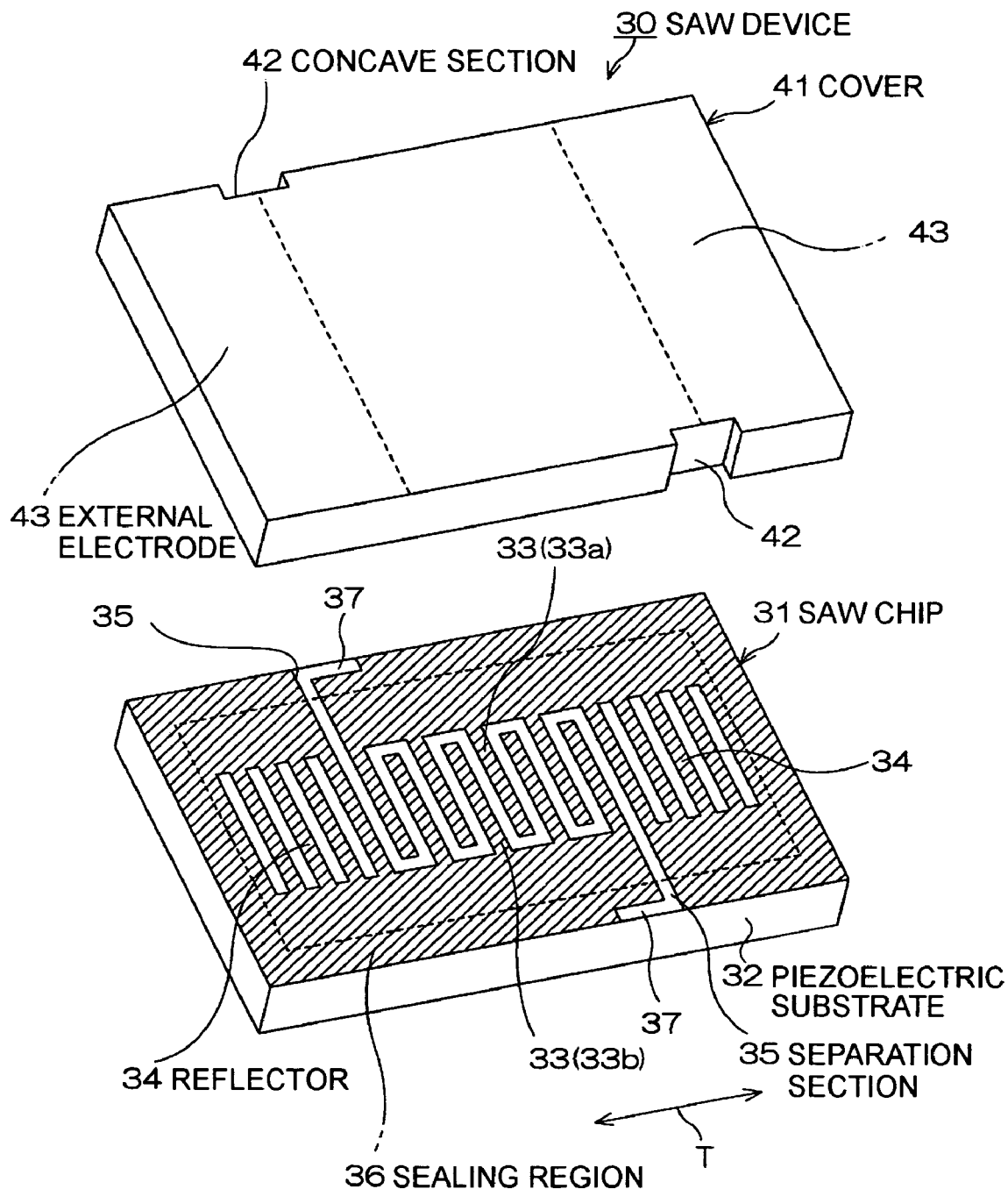
FIG. 1 is a schematic exploded perspective view of a SAW device in a first embodiment of the invention.

FIG. 1 is a schematic exploded perspective view of a SAW device in a first embodiment of the invention.

In the drawing, a SAW device 30 is provided with a SAW chip (surface acoustic wave chip) 31, and a cover 41. The cover 41 seals the SAW chip 31 through attachment thereto. As shown in FIG. 1, the SAW chip 31 is provided with a piezoelectric substrate 32, an inter-digital transducer (comb electrode; IDT) 33, and reflectors 34.

The piezoelectric substrate 32 may be made of crystal, lithium tantalite ($LiTaO_3$), or lithium niobate ($LiNbO_3$), or the like, and may be of single crystal substrate, multilayer substrate derived by ZnO (zinc oxide) layer formation on a Si (silicon) substrate, or the like. The present embodiment uses a crystal substrate, for example.

The piezoelectric substrate 32, i.e., the active surface, is first formed with a thin layer of conductive metal exemplified by aluminum or titanium by vapor deposition, sputtering, or the like. The IDT 33 and the reflectors 34 are then formed to be strip-like entirely over the resulting piezoelectric substrate 32 by photolithography or the like which will be described later. Such an electrode pattern is formed to the shaded region on the surface of the piezoelectric substrate 32 of FIG. 1.

More in detail, the IDT 33, i.e., IDT electrodes 33a and 33b, is formed with a plurality of electrode fingers with those arranged in the horizontal direction at a predetermined pitch in such a manner that the base end portions in the longitudinal direction are both short-circuited. That is, the comb-tooth portions of the comb-like IDT electrodes 33a and 33b are formed so as to oppose each other so that their electrode fingers dig into each other with a predetermined distance, and the IDT electrodes 33a and 33b form a pair as shown in the drawing.

In the present embodiment, the IDT 33 is formed entirely over one surface of the piezoelectric substrate 32, i.e., upper surface in the drawing. The electrode pattern of the IDT 33 is extended to the outer edge of the piezoelectric substrate 32, and thus is forming no terminal as previously known. In the electrode pattern configuring the IDT 33, the edge portion extended to the outer edge portions of the piezoelectric substrate 32, i.e., a dotted region, serves as a sealing region 36 for attachment with the cover 41. As such, the present embodiment is characterized in using a part of the electrode pattern of the IDT 33 as the sealing region 36 without partitioning the electrode pattern.

The IDT electrodes 33a and 33b are separated from each other by partition sections 35 so as not to cause a short circuit. The partition sections 35 are each extended to the outer edge portions of the piezoelectric substrate 32, and serve to partition the opposing electrode patterns into strips. At the outer edge portions of the partition sections on the piezoelectric substrate 32, one of the electrode patterns is notched so that notch sections 37 and 37 are formed. In this manner, the risk of a short circuit between the electrodes is prevented with certainty as will be described later.

Although a description will be given later, the IDT 33 is electrically connected with external electrodes 43, which are formed on the side of the cover 41. Through these external electrodes 43, the IDT 33 serves to perform conversion between electric signals and surface acoustic waves (SAW).

The IDT 33 is provided on both sides with the reflectors 34. Similarly to the IDT 33, the reflectors 34 are each formed by a plurality of conductive strips being arranged in the horizontal direction at a predetermined pitch so that the both end portions are short-circuited.

The reflectors 34 have the same configuration, and are formed so that their conductive strips are parallel to the electrode fingers of the IDT 33, and the IDT 33 is sandwiched therebetween with a predetermined distance in the direction orthogonal to the longitudinal direction of the electrode fingers of the IDT 33. The longitudinal direction is indicated by an arrow T, along which the surface acoustic waves are transmitted. The reflectors 34 reflect the surface acoustic waves coming from the IDT 33, and trap therein the energy of the surface acoustic waves.

In such a configuration, once electrical signals are input to the IDT 33 through the external terminal, the signals are converted into surface acoustic waves through piezoelectric effect. The surface acoustic waves are transmitted in the direction of arrow T, i.e., direction orthogonal to the longitudinal direction of the electrode fingers 33a of the IDT 33, and then reflected by the reflectors 34 from both sides of the IDT 33. At this time, the surface acoustic waves being at a transmission speed, and having the wavelengths equal to an electrode pitch do of the electrode fingers 33a of the IDT 33 are most excited. Here, the transmission speed is determined by the material of the piezoelectric substrate 32, the electrode thickness or width, or the like. The surface acoustic waves are reflected, in multistage, by the reflectors 34, and then are put back to the IDT 33. The surface acoustic waves are then converted into electric signals of a frequency, i.e., operation frequency, in a close range of resonance frequency. The resulting electric signals are output from the IDT 33 via the external electrodes 43.

The cover 41 is a plate-like member made of an insulation material. In this example, the cover 41 is a glass-made plate-like member having the same outer shape as the piezoelectric substrate 32.

The cover 41 is disposed on the piezoelectric substrate 32 as shown in the drawing, and is attached thereto through anode attachment. For anode attachment, as will be described later, the underside of the cover 41 that is not shown is thus formed with an attachment layer at a portion corresponding to the sealing region 36 of the piezoelectric substrate 32. Also on the underside of the cover 41, regions corresponding to the IDT 33 and the reflectors 34 are made concave, i.e., cavities.

The cover 41 is formed with concave sections 42 at the side end portions, i.e., at portions to be placed over the partition sections 35 of the piezoelectric substrate 32. More specifically, after the piezoelectric substrate 32 is attached with the cover 41, the concave sections 42 are formed so that the electrode patterns of the IDT electrodes 33a and 33b on the piezoelectric substrate 32 are both partially exposed therefrom. With a configuration such, as will be described later in a description about a manufacturing process, an electrical connection is established between the IDT 33 and the external electrodes 43 formed on the cover 41.

Figure 27A:
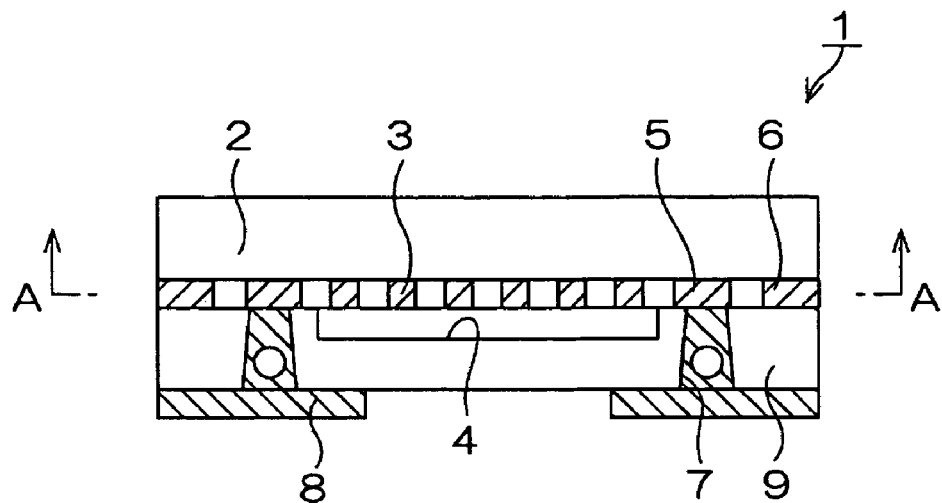
FIGS. 27A and 27B are both diagrams showing an exemplary SAW device of a previously-known type.
Figure 27B:
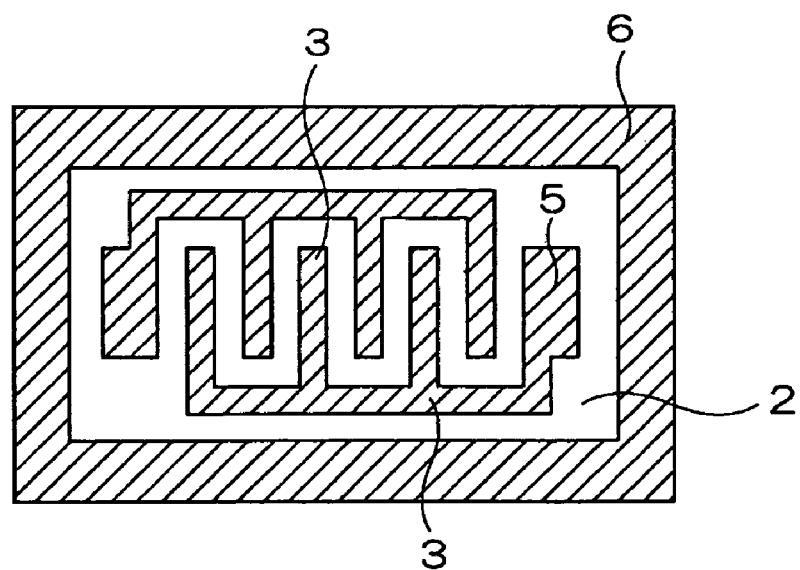

The SAW device 30 of the present embodiment takes a configuration such as described above, and unlike the previously-known SAW device of FIGS. 27A and 27B, the terminals of the IDT disposed on the piezoelectric substrate are not specifically away from the electrode pattern for anode attachment.

In other words, the IDT is formed entirely over the piezoelectric substrate 32, and thus the space can be effectively used so that the SAW device 30 can be reduced in size in its entirety.

SAW Device Manufacturing Method a. Preprocessing

Described next is a manufacturing method for implementing the SAW device 30 by referring to FIGS. 2 to 10. In preprocessing, the SAW chip and the cover are individually formed.

Figure 2:
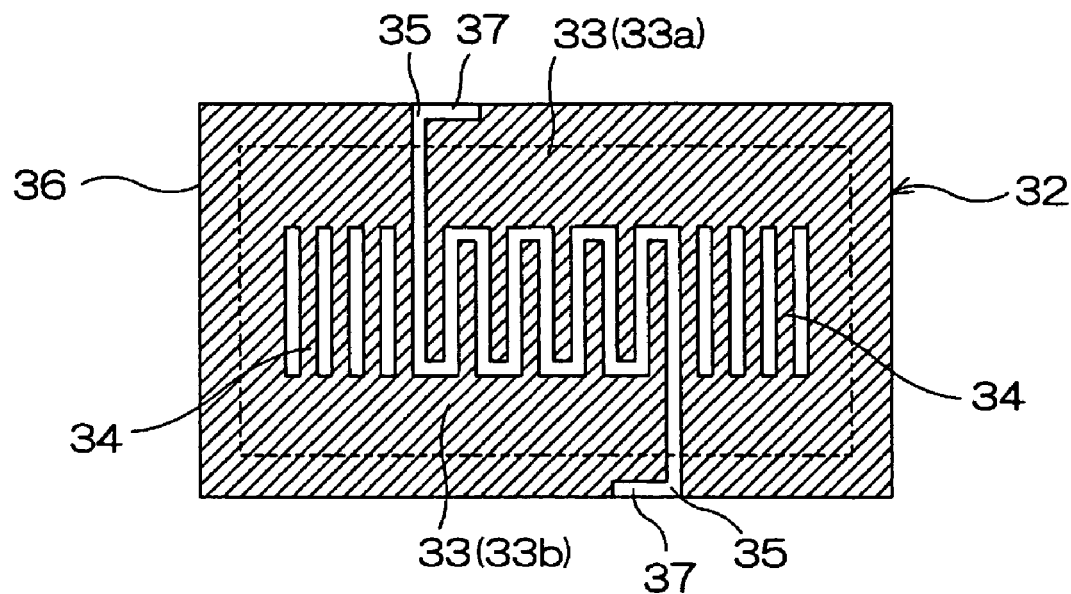
FIG. 2 is a diagram showing a part of a manufacturing process in a manufacturing method for implementing the SAW device of FIG. 1.

By referring to FIG. 2, a material such as crystal wafer is made ready for forming the piezoelectric substrate 32. As will be described later, the crystal wafer to be ready at this time will be of a size that is not yet cut into products of varying in size, i.e., of a size sufficient for a plurality of piezoelectric substrates to be cut therefrom. In FIG. 2 and others, for the sake of understanding, the piezoelectric substrate 32 of a product size is shown for description.

The crystal wafer serving as the piezoelectric substrate 32 is formed thereover with the IDT electrodes 33a and 33b, and the reflectors 34. In this embodiment, first of all, a layer of aluminum (Al) or aluminum alloy is formed entirely over the piezoelectric substrate 32 by sputtering or vapor deposition.

A resist pattern is then formed to a region for the IDT electrodes 33a and 33b and the reflectors 34. The resulting region is exposed and developed by photolithography so that any not-masked portions are eliminated by etching. In this manner, formed is an aluminum pattern, i.e., electrode pattern, serving as the IDT electrodes 33a and 33b and the reflectors 34.

The description is already made by referring to FIG. 1 about the regions for the IDT electrodes 33a and 33b and the reflectors 34, and about the partition sections 35 and the notch sections 37. Therefore, the same description will not be repeated to avoid redundancy.

Figure 3:
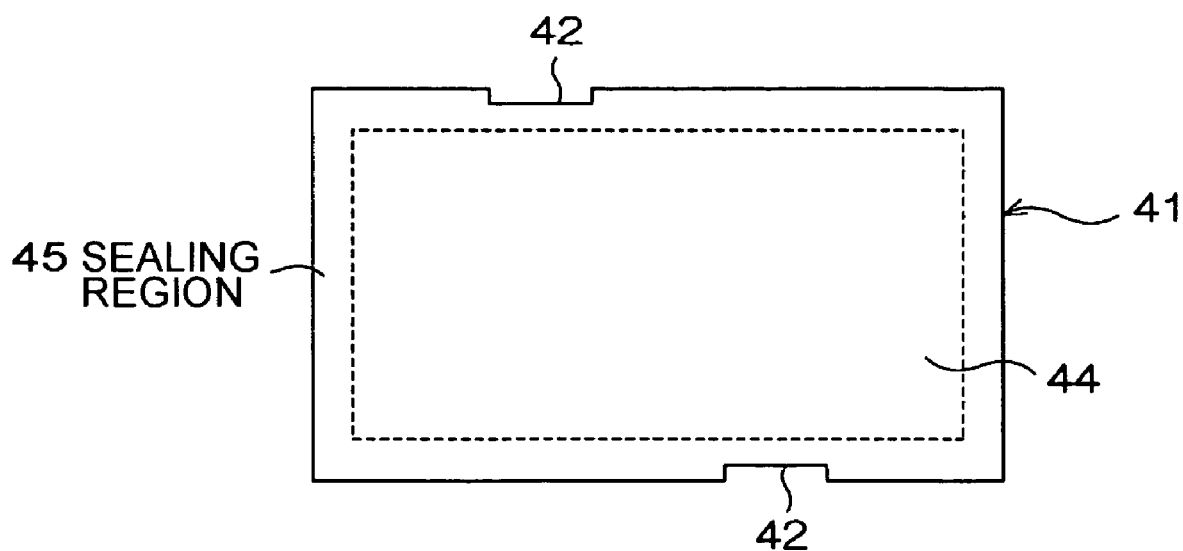
FIG. 3 is another diagram showing a part of the manufacturing process in the manufacturing method for implementing the SAW device of FIG. 1.

FIG. 3 shows the cover 41. In the present embodiment, a glass-made plate-like member having the same outer shape, i.e., rectangular, as the piezoelectric substrate is formed at the outer edge portions with two concave sections 42. The cover 41 is formed with a sealing region 45 along the outer edge portions, and inside of the sealing region 45, a concave section or cavity 44 is formed. Such cavity formation may be performed in the glass manufacturing process, or the rectangular plate glass may be accordingly cut. The sealing region 45 is formed with an attachment layer on the sealing surface, i.e., surface for attachment with the piezoelectric substrate. The attachment layer can be attached, through anode attachment, with a metal electric pattern formed to the piezoelectric substrate. The attachment layer herein is exemplified by a glass coating of a type attachable with aluminum or aluminum alloy, and is formed by baking or the like. That is, to the sealing region 45, a coating of Pyrex® glass is formed as a glass including moving ions, for example.

b. Sealing

Figure 4:
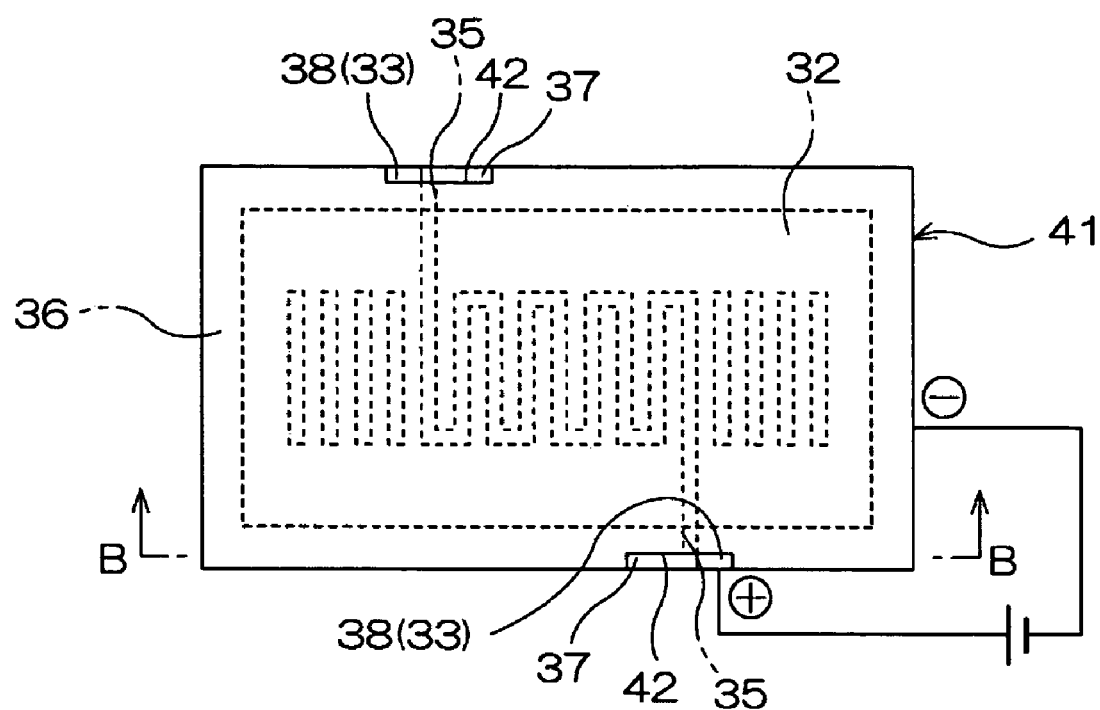
FIG. 4 is still another diagram showing a part of the manufacturing process in the manufacturing method for implementing the SAW device of FIG. 1.
Figure 5:
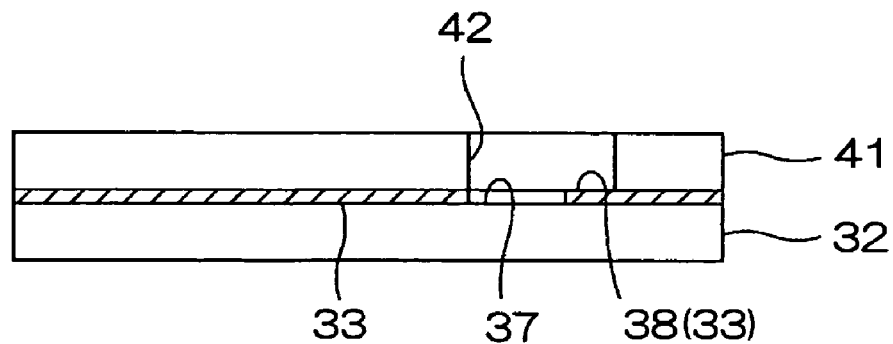
FIG. 5 is a schematic cross sectional view along a line B-B of FIG. 4.

As shown in FIGS. 4 and 5, the piezoelectric substrate 32 is covered with the cover 41. FIG. 5 is a schematic cross sectional view along a line B-B of FIG. 4. The piezoelectric substrate 32 covered with the cover 41 is heated to a specific temperature under nitrogen atmosphere, and then applied with direct voltage as shown in FIG. 4. Here, the temperature is equal to or lower than a softening point of the Pyrex® glass, and is equal to or lower than a melting point of aluminum. That is, the cover 41 is attached to the piezoelectric substrate 32 through anode attachment. In this state, from the concave portions 42 of the cover 41, exposing sections 38 are each exposed, i.e., the outer end portions of the IDT 33 extending all the way to the rim of the piezoelectric substrate 32. The portions adjacent to the exposing sections 38 are the notch sections 37 formed with no electrode.

Figure 6:
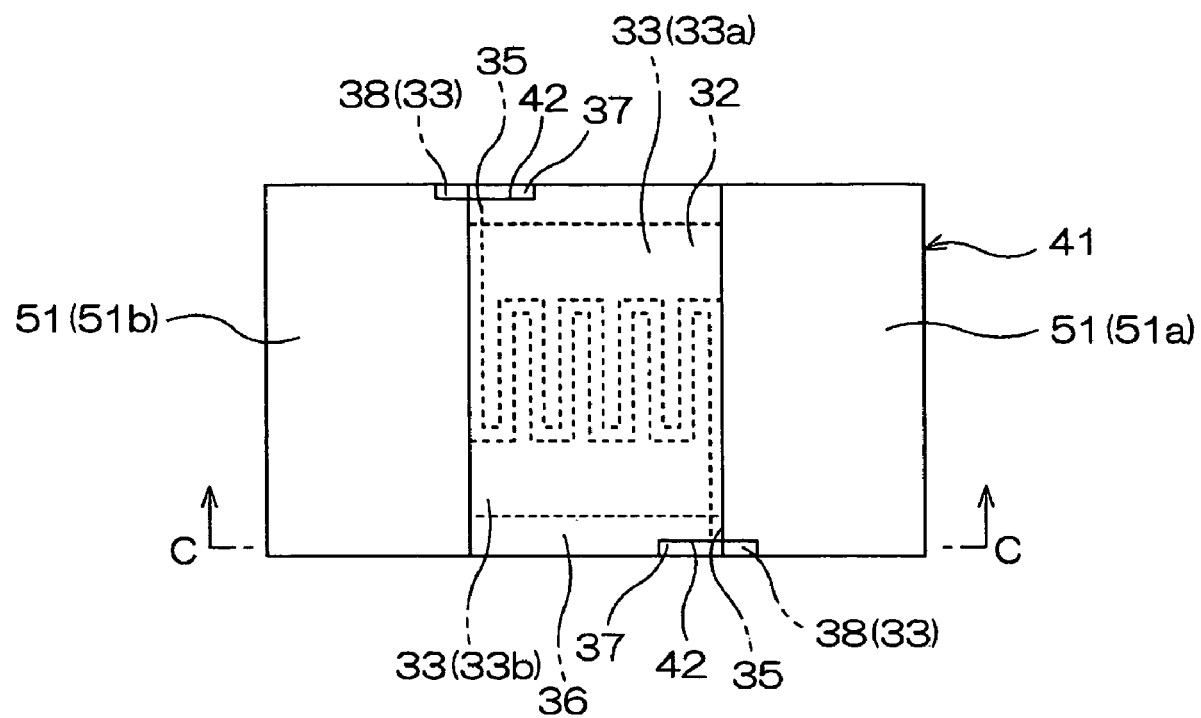
FIG. 6 is still another diagram showing a part of the manufacturing process in the manufacturing method for implementing the SAW device of FIG. 1.
Figure 7:
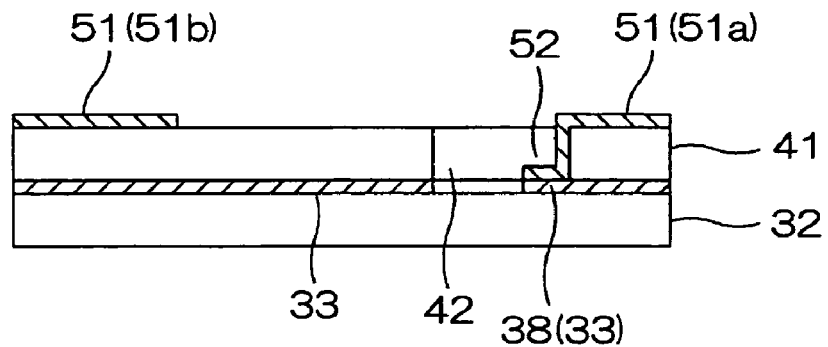
FIG. 7 is a schematic cross sectional view along a line C-C of FIG. 6.

By referring to FIGS. 6 and 7, external electrodes 51 are formed at both end portions of the cover 41. FIG. 7 is a schematic cross sectional view along a line C-C of FIG. 6. The external electrodes 51 are to be formed by aluminum sputtering or vapor deposition with the cover 41 masked as appropriate.

When such external electrodes 51 are manufactured, as shown in FIG. 7, the metal layer forming an external electrode 51a is disposed so as to reach down on the corresponding exposing section 38. This is possible because the exposing section 38 is exposed from the concave portion 42 of the cover 41.

That is, the exposing section 38 that is the portion of the IDT 33 extended to the rim of the piezoelectric substrate 32 is utilized as it is as a connection terminal with the external electrode 51a. The metal layer of the external electrode 51 connected with the exposing section 38 does not cause a short circuit between electrode patterns even if the layer lies beyond the exposing section 38 to some extent. This is because the adjacent notch section 37 has no electrode pattern.

The issue here is that the exposing section 38 of the IDT 33 is an aluminum electrode, and used as a connection terminal. Before the exposing section 38 is connected to the external electrode 51a after formed, there may be a possibility that a natural oxide layer may be formed, and the continuity performance may be impaired. With this being the case, the exposing section 38 may be formed with a metal bump, e.g., gold bump, as if to break the natural oxide layer. Thus formed metal bump may be used to establish continuity with the external electrode 51a therethrough.

Figure 8:
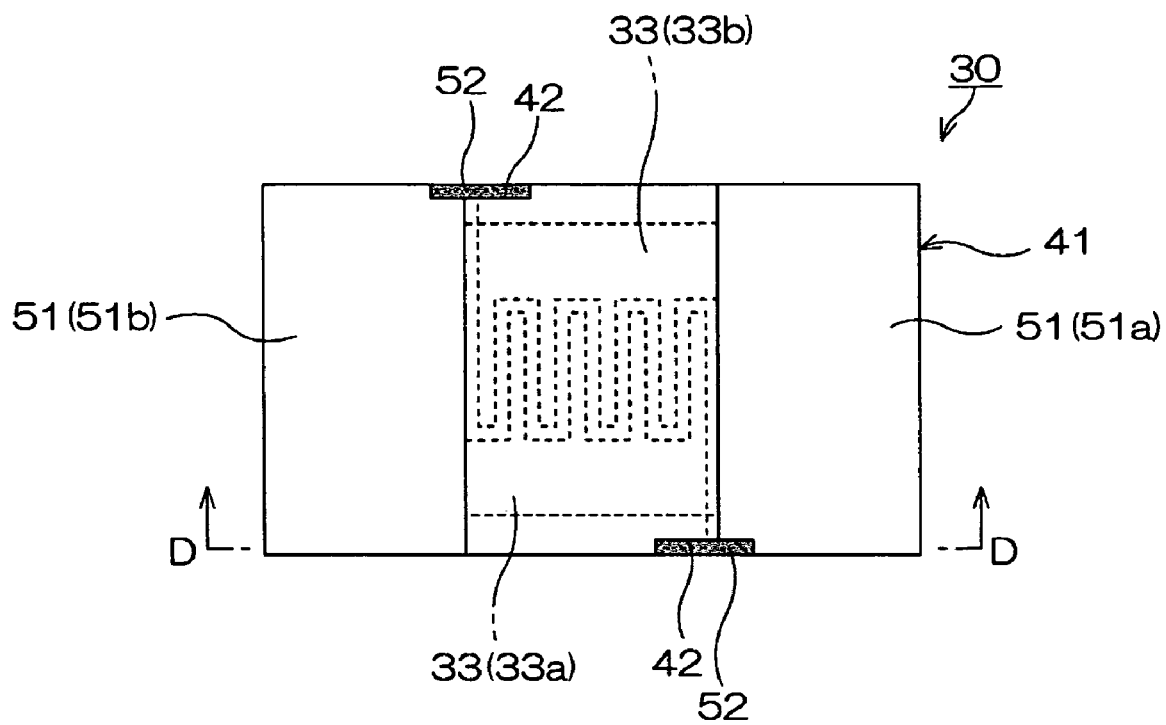
FIG. 8 is still another diagram showing a part of the manufacturing process in the manufacturing method for implementing the SAW device of FIG. 1.
Figure 9:
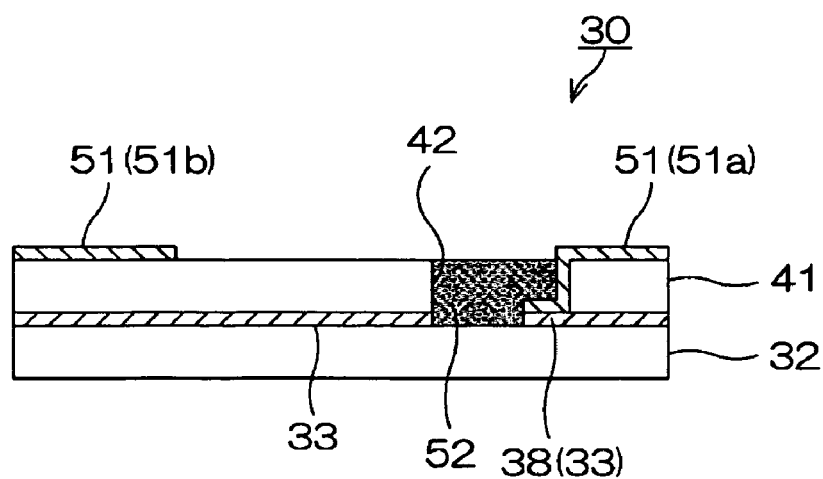
FIG. 9 is a schematic cross sectional view along a line D-D of FIG. 8.

Thereafter, by referring to FIGS. 8 and 9, the concave sections 42 formed in the cover 41 are sealed. FIG. 9 is a schematic cross sectional view along a line D-D of FIG. 8.

The concave sections 42 are filled with a filler 52 of an insulation material, e.g., melted low-melting-point glass. The concave sections 42 are thus sealed airtight without causing a short circuit between electrode patterns.

Figure 10:
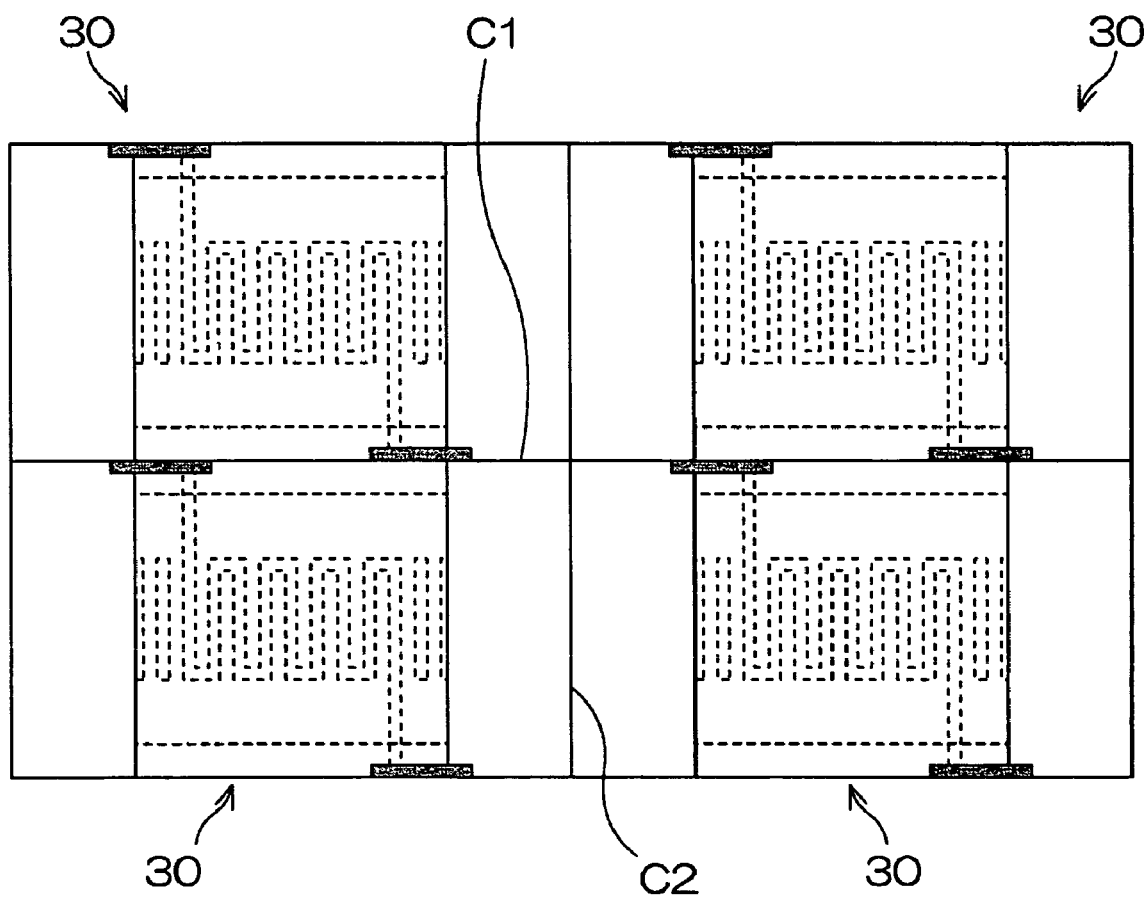
FIG. 10 is still another diagram showing a part of the manufacturing process in the manufacturing method for implementing the SAW device of FIG. 1.

FIG. 10 shows a plurality of SAW devices 30 being disposed as a unit, one next to another and one above another. The process is executed with the crystal wafer configuring the piezoelectric substrate being of a piece, i.e., as described above, of a size sufficient for a plurality of or many products.

As a last step, the piezoelectric substrate is diced along cutting liens of C1 and C2 of FIG. 10 so that the SAW devices are separated from one another.

Note here that the filler 52 described by referring to FIGS. 8 and 9 for hole sealing is filled from above the concave sections 42.

Figure 11:
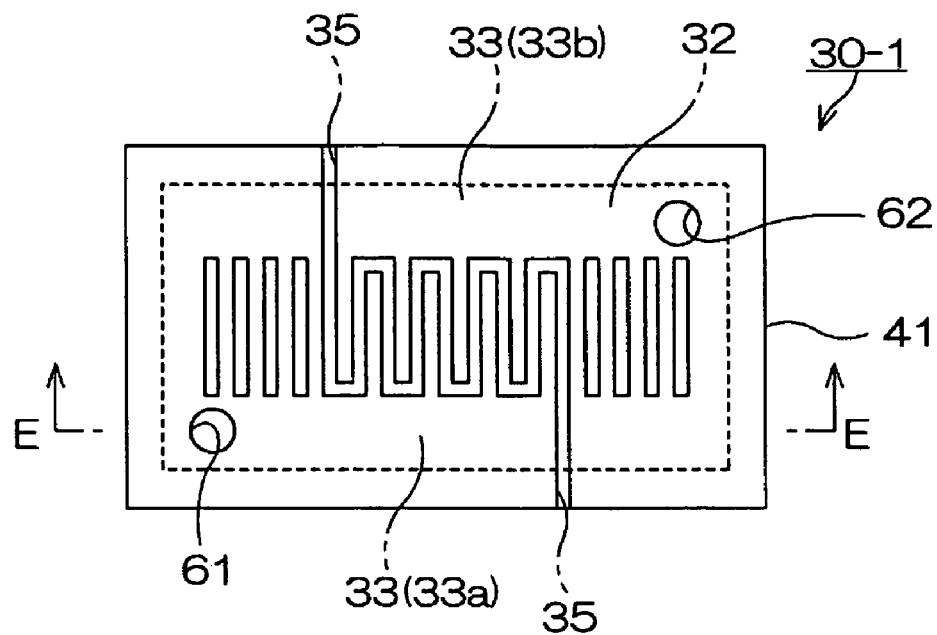
FIG. 11 is a schematic plan view of a SAW device in a second embodiment of the invention.
Figure 12:
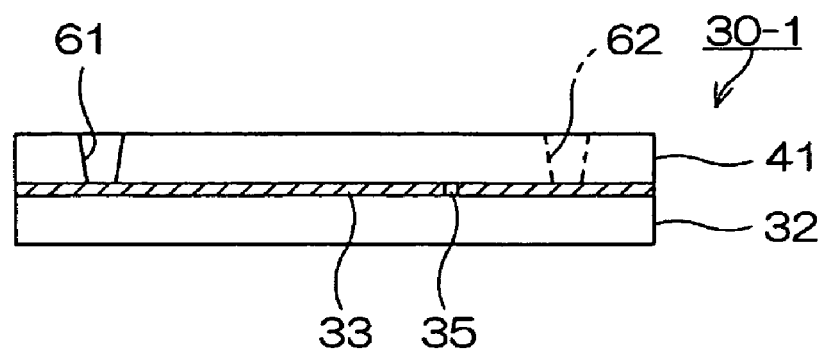
FIG. 12 is a cross sectional view along a line E-E of FIG. 11.

FIGS. 11 and 12 are both diagrams for a second embodiment of a SAW device. Specifically, FIG. 11 is a schematic plan view of a SAW device 30-1, and FIG. 12 is a schematic cross sectional view along a line E-E of FIG. 11.

In FIGS. 11 and 12, any component identical to that in the first embodiment is provided with the same reference numeral, and only differences from the first embodiment are described below to avoid redundancy.

Unlike the first embodiment, the cover 41 is formed with no concave section. Alternatively, the cover 41 herein is formed with through holes 61 and 62 at portions corresponding to the electrode finger patterns 33a and 33b, respectively. The electrode finger patterns 33a and 33b form an electrode pair for the IDT 33 of the piezoelectric substrate 32. The through holes 61 and 62 are also each formed at a position corresponding to its corresponding external electrode. The external electrodes herein are formed at the same position as the external electrodes 51a and 51b of the first embodiment, but not shown here. The through holes 61 and 62 are each formed therein with a metal layer at the time when the external electrodes are layered so that the through holes become conductive.

The through holes 61 and 62 thus establish an electrical connection between the external electrodes and the IDT 33.

The second embodiment has advantages of achieving size reduction as does the first embodiment, and of forming the through holes 61 and 62 at any arbitrary positions as long as not on the partition sections 35, and as long as on the positions corresponding to the electrode finger patterns 33a and 33b. Another advantage is that hole sealing is not needed.

The invention is not restrictive to the above-described embodiments, and the components of the embodiments can be omitted as appropriate or combined with any other components not shown.

The reflectors are provided in the above embodiments, but this is not required. The piezoelectric substrate and the cover are both not necessarily rectangular, but may take any shape. The glass is not the only material option for the cover, and any other material will do as long as it is insulative, and allows anode attachment with metal portions of the IDT electrodes.

Figure 13:
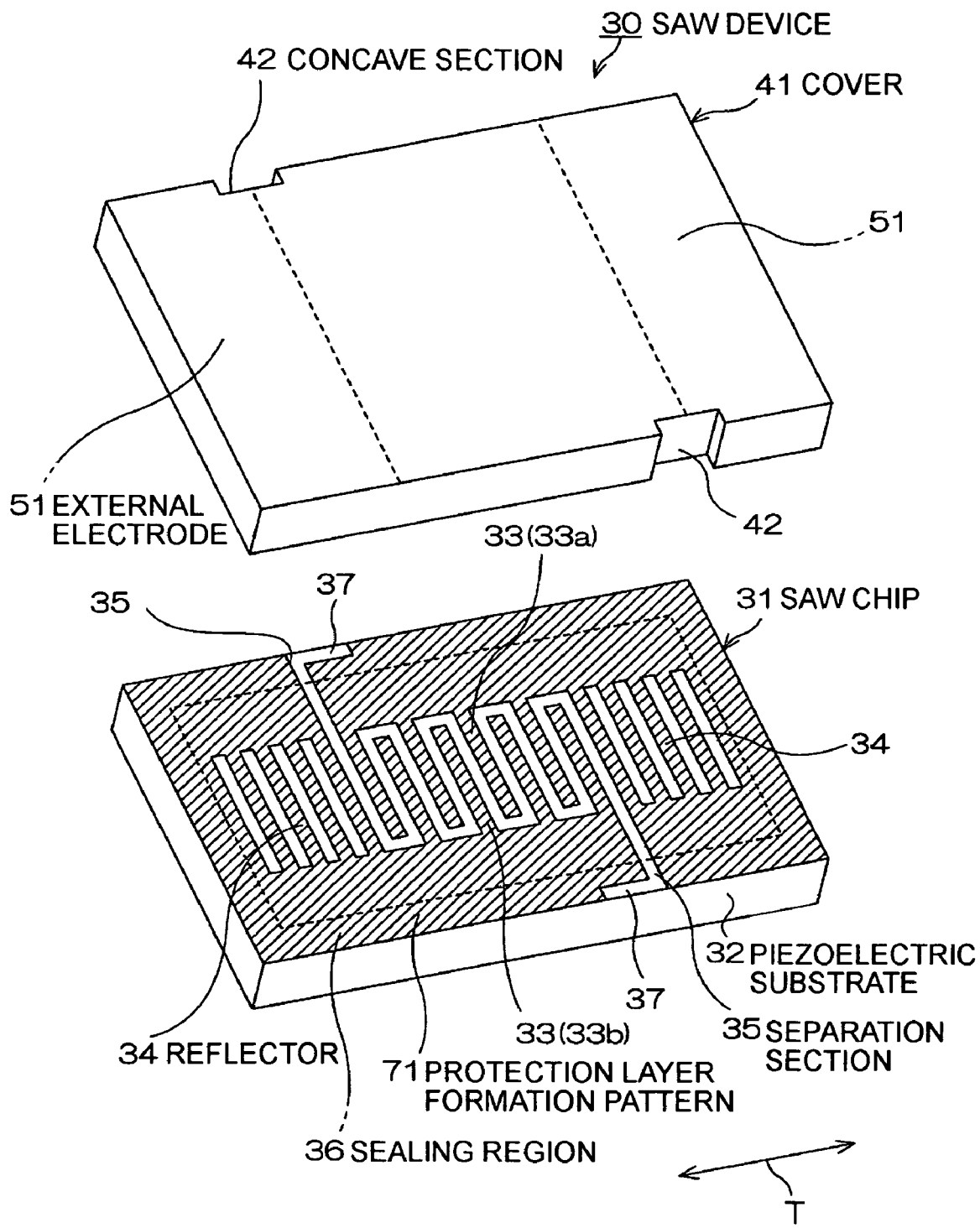
FIG. 13 is a schematic exploded perspective view of a SAW device in a third embodiment of the invention.

FIG. 13 is a schematic exploded perspective view of the SAW device in the second embodiment of the invention. Any component identical to that of FIG. 1 is provided with the same reference numeral. In FIG. 13, the SAW device 30-1 is provided with the SAW chip (surface acoustic wave chip) 31, and the cover 41. The cover 41 seals the SAW chip 31 through attachment thereto. As shown in FIG. 13, the SAW chip 31 is provided with the piezoelectric substrate 32, the inter-digital transducer (comb electrode; IDT) 33, and the reflectors 34.

The piezoelectric substrate 32 may be made of crystal, lithium tantalite (LiTaO$_3$), or lithium niobate (LiNbO$_3$), or the like, and may be of single crystal substrate, multilayer substrate derived by ZnO (zinc oxide) layer formation on a Si (silicon) substrate, or the like. The present embodiment uses a crystal substrate, for example.

The piezoelectric substrate 32, i.e., active surface, is first formed with a thin layer of conductive metal exemplified by aluminum or titanium by vapor deposition, sputtering, or the like. The IDT 33 and the reflectors 34 are then formed to be strip-like entirely over the resulting piezoelectric substrate 32 by photolithography or the like which will be described later. Such an electrode pattern is formed to the shaded region on the surface of the piezoelectric substrate 32 of FIG. 13.

More in detail, in the IDT 33, i.e., IDT electrodes 33*a* and 33*b*, a plurality of electrode fingers are arranged in the horizontal direction at a predetermined pitch in such a manner that the base end portions in the longitudinal direction are both short-circuited. That is, the comb-tooth portions of the comb-like IDT electrodes 33*a* and 33*b* are formed so as to oppose each other so that their electrode fingers dig into each other with a predetermined distance, and the IDT electrodes 33*a* and 33*b* form a pair.

In the present embodiment, the IDT 33 is formed entirely over one surface of the piezoelectric substrate 32, i.e., upper surface in the drawing. The electrode pattern of the IDT 33 is extended to the outer edge of the piezoelectric substrate 32, and thus is forming no terminal as previously known. In the electrode pattern configuring the IDT 33, the edge portion extended to the outer edge portions of the piezoelectric substrate 32 as such, i.e., a dotted region, serves as the sealing region 36 for attachment with the cover 41. As such, the present embodiment is characterized in using a part of the electrode pattern of the IDT 33 as the sealing region 36 without partitioning the electrode pattern.

What is more, a part of the electrode pattern facing the outer edge of the piezoelectric substrate 32, i.e., the sealing region 36 in its entirety or any portion thereof, is used as a protection layer formation pattern 71 in a manufacturing process, which will be described later.

The IDT electrodes 33*a* and 33*b* are separated from each other by the partition sections 35 so as not to be short-circuited. The partition sections 35 are each extended to the outer edge portions of the piezoelectric substrate 32, and serve to partition the opposing electrode patterns into strips. At the outer edge portions of the partition sections on the piezoelectric substrate 32, one of the electrode patterns is notched so that notch sections 37 are formed. In this manner, the risk of a short circuit is prevented with certainty.

Although a description will be given later, the IDT 33 is electrically connected with external electrodes 51, which are formed on the side of the cover 41. Through the external electrodes 51, the IDT 33 serves to perform conversion between electric signals and surface acoustic waves (SAW).

The IDT 33 is provided on both sides with the reflectors 34. Similarly to the IDT 33, the reflectors 34 are each formed by a plurality of conductive strips being arranged in the horizontal direction at a predetermined pitch so that the both end portions are short-circuited.

The reflectors 34 have the same configuration, and are formed so that their conductive strips are parallel to the electrode fingers of the IDT 33, and the IDT 33 is sandwiched therebetween with a predetermined distance in the direction orthogonal to the longitudinal direction of the electrode fingers of the IDT 33. The longitudinal direction is indicated by an arrow T, along which the surface acoustic waves are transmitted. The reflectors 34 reflect the surface acoustic waves coming from the IDT 33, and trap therein the energy of the surface acoustic waves.

Such IDT 33 and reflectors 34 are formed to be a piece by the electrode pattern, and the surface is formed thereon with an oxide layer for protection, e.g., an anode oxide layer (not shown) in this embodiment. The oxide layer is formed by utilizing the protection layer formation pattern 71.

In such a configuration, once electrical signals are input to the IDT 33 through the external terminal, the signals are converted into surface acoustic waves through piezoelectric effect. The surface acoustic waves are transmitted in the direction of arrow T, i.e., direction orthogonal to the longitudinal direction of the electrode fingers 33*a* of the IDT 33, and then reflected by the reflectors 34 from both sides of the IDT 33. At this time, the surface acoustic waves being at a transmission speed, and having the wavelengths equal to the electrode pitch do of the electrode fingers 33*a* of the IDT 33 are most excited. Here, the transmission speed is determined by the material of the piezoelectric substrate 32, the electrode thickness or width, or the like. The surface acoustic waves are reflected, in multistage, by the reflectors 34, and then are put back to the IDT 33. The surface acoustic waves are then converted into electric signals of a frequency, i.e., operation frequency, in a close range of resonance frequency. The resulting electric signals are output from the IDT 33 via the external electrodes 51.

The cover 41 is a plate-like member made of an insulation material. In this example, the cover 41 is a glass-made plate-like member having the same outer shape as the piezoelectric substrate 32.

The cover 41 is disposed on the piezoelectric substrate 32 as shown in the drawing, and is attached thereto through anode attachment. For anode attachment, as will be described later, the underside of the cover 41 that is not shown is thus formed with an attachment layer at a portion corresponding to the sealing region 36 of the piezoelectric substrate 32. Also on the underside of the cover 41, regions corresponding to the IDT 33 and the reflectors 34 are made concave, i.e., cavities.

The cover 41 is formed with the concave sections 42 and 42 at the side end portions, i.e., at portions to be placed over the partition sections 35 of the piezoelectric substrate 32. More specifically, after the piezoelectric substrate 32 is attached with the cover 41, the concave sections 42 and 42 are formed so that the electrode patterns of the IDT electrodes 33*a* and 33*b* of the piezoelectric substrate 32 are both partially exposed therefrom. With a configuration such, as will be described later in a description about a manufacturing process, an electrical connection is established between the IDT 33, and the external electrodes 51 formed on the cover 41.

Figure 28:
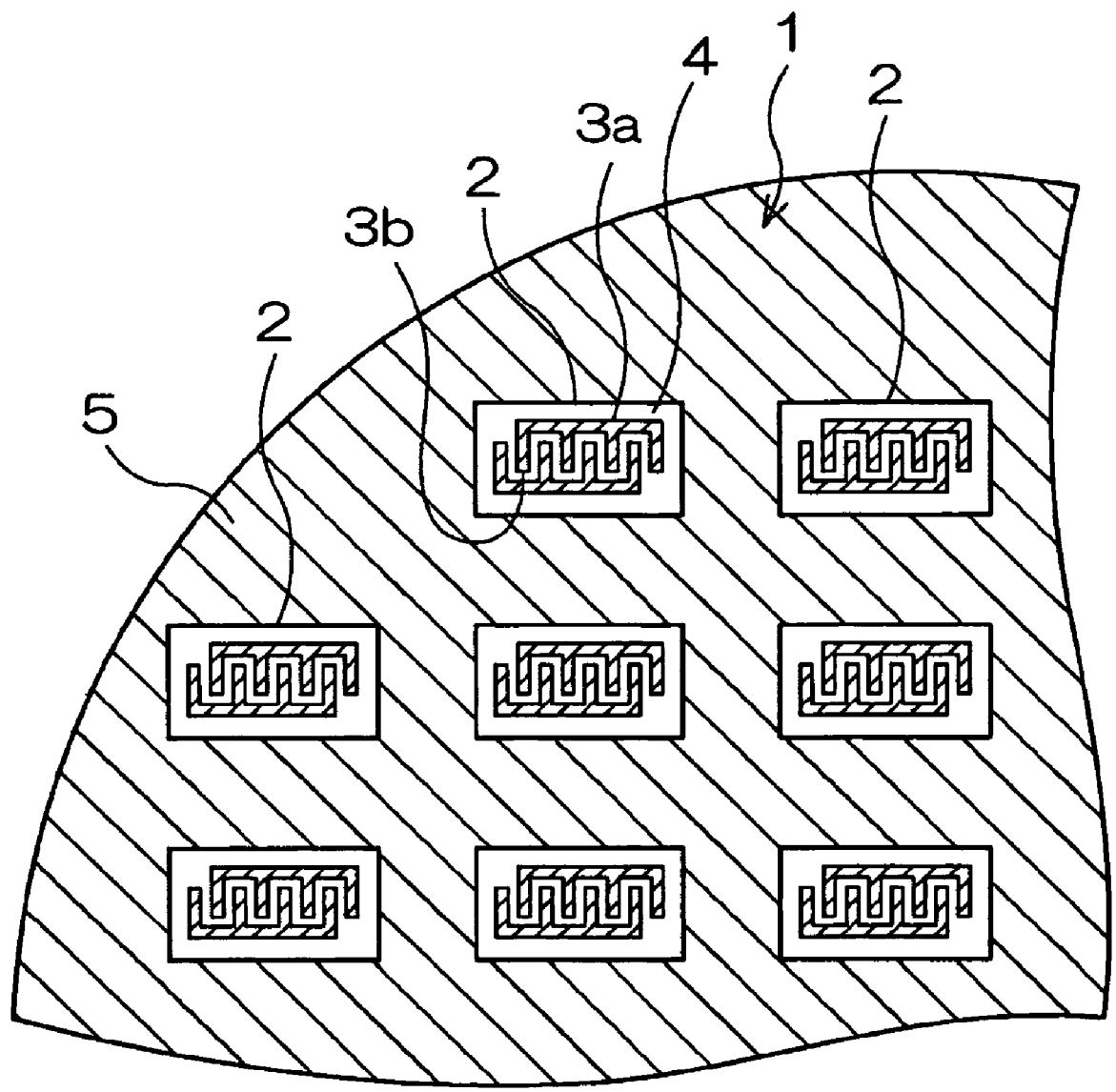
FIG. 28 is a diagram showing another exemplary SAW device of a previously-known type.
Figure 29A:
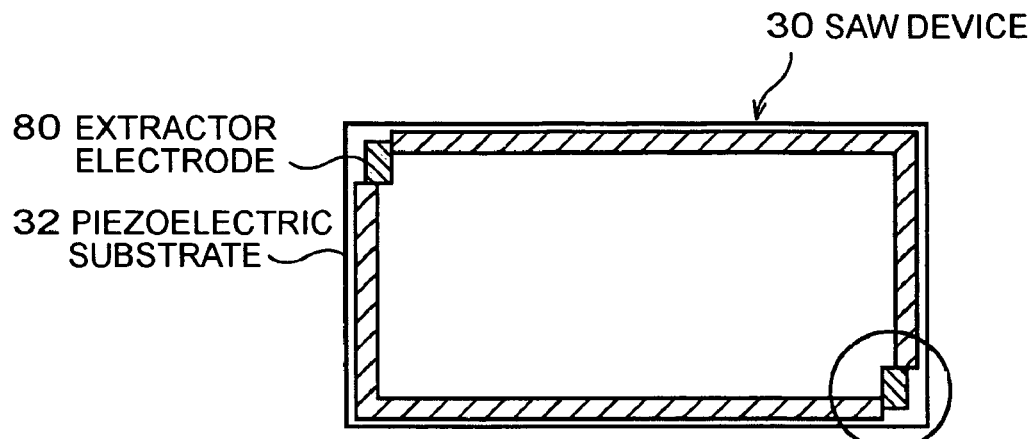
FIGS. 29A and 29B are both diagrams showing still another exemplary SAW device of a previously-known type.
Figure 29B:
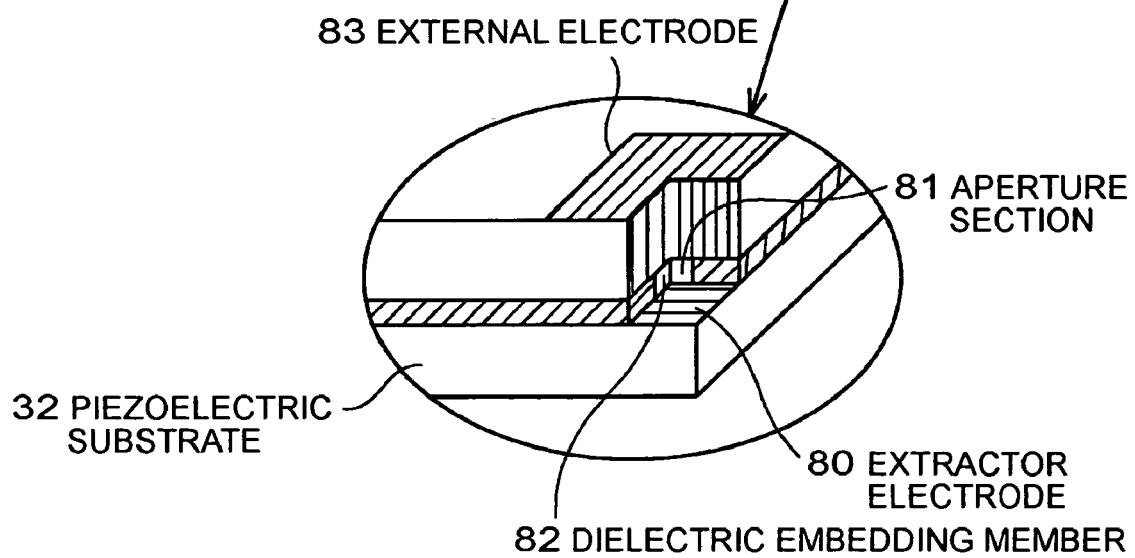

The SAW device 30-1 of the present embodiment takes a configuration such as described above, and unlike the previously-known SAW device of FIG. 28, the terminals of the IDTs disposed on the piezoelectric substrate are not specifically away from the electrode pattern for anode attachment.

In other words, the IDT is formed entirely over the piezoelectric substrate 32, and thus the space can be effectively used so that the SAW device 30-1 can be reduced in size in its entirety.

What is more, the electrode pattern forming the IDT 33 is extended all the way to the outer edge of the piezoelectric substrate 32, and the electrode pattern facing the outer edge is used as the protection layer formation pattern 71. This eases formation of a protection layer being an anode oxide layer in a manufacturing process that will be described later.

SAW Device Manufacturing Method a. Preprocessing

Described next is a manufacturing method for implementing the SAW device 30, by referring to FIGS. 14 to 22. In the preprocessing step, the SAW chip and the cover are individually formed, i.e., substrate preprocessing.

Figure 14:
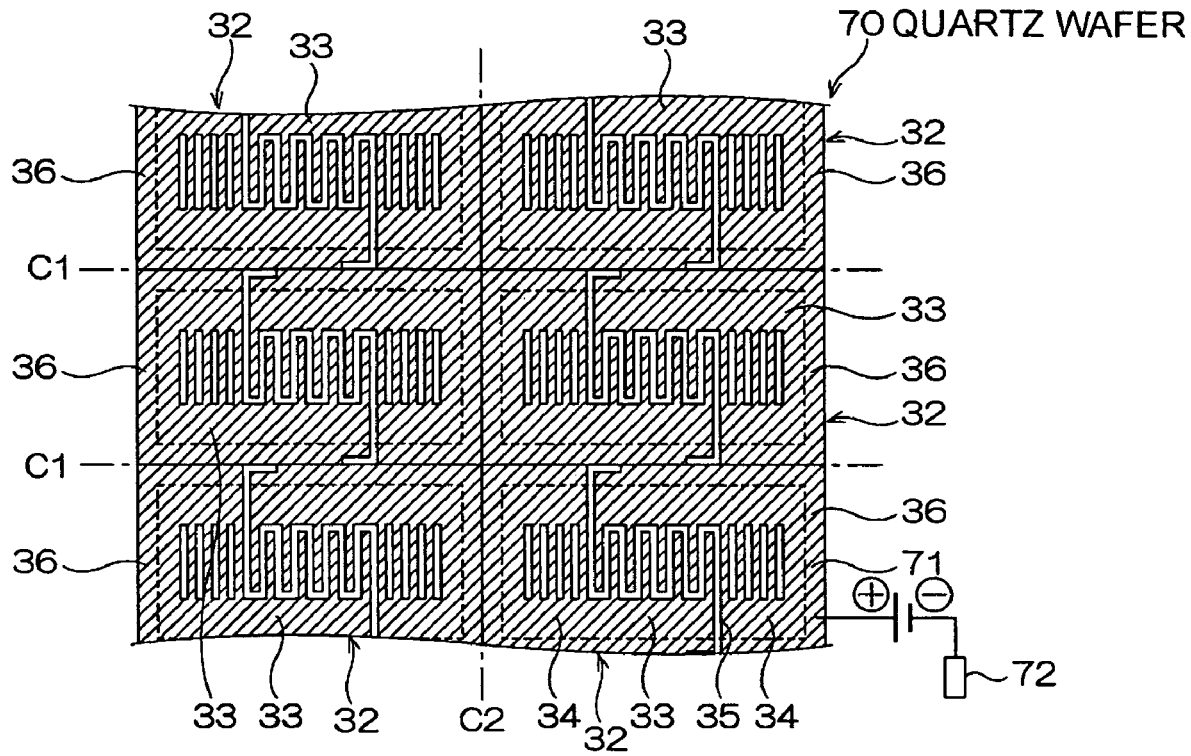
FIG. 14 is a diagram showing a part of a manufacturing process in a manufacturing method for implementing the SAW device of FIG. 13.
Figure 15:
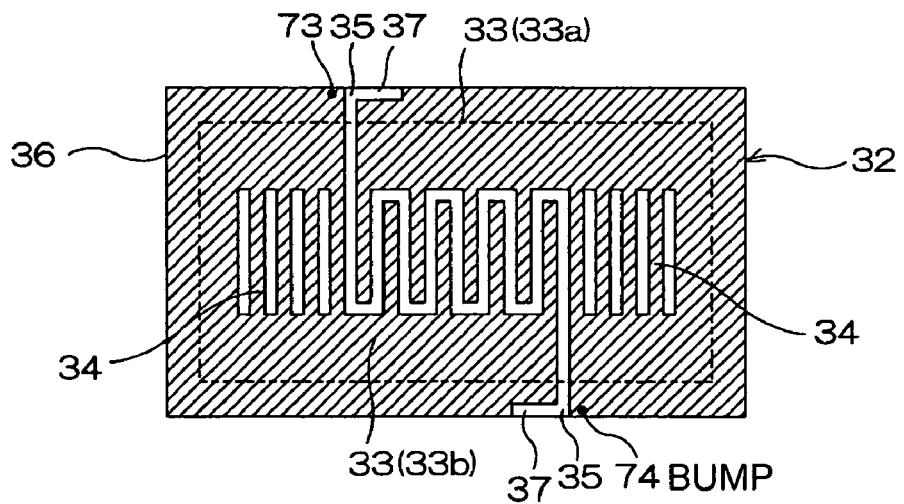
FIG. 15 is another diagram showing a part of the manufacturing process in the manufacturing method for implementing the SAW device of FIG. 13.
Figure 16:
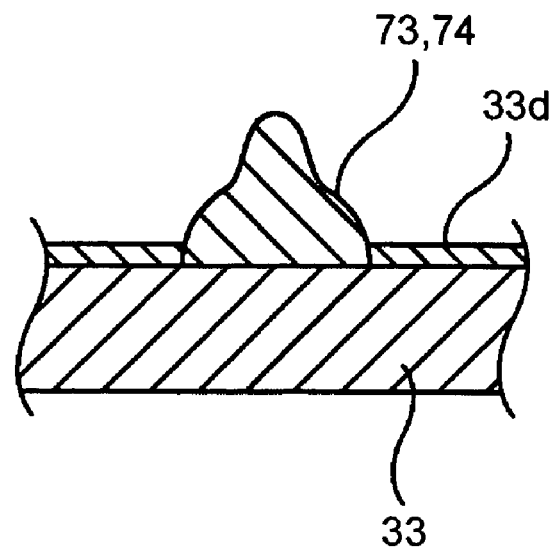
FIG. 16 is a partial cross sectional view of a metal bump formed in a part of the manufacturing process in the manufacturing method for implementing the SAW device of FIG. 13.

By referring to FIG. 14, a member such as crystal wafer 70 is made ready for forming the piezoelectric substrate 32. As will be described later, the crystal wafer to be ready at this time will be of a size that is not yet cut into products of varying in size, i.e., of a size sufficient for a plurality of piezoelectric substrates to be cut therefrom. In FIG. 15 and others, for the sake of understanding, the piezoelectric substrate 32 of a product size is shown for description.

The crystal wafer 70 serving as the piezoelectric substrate 32 is formed entirely with the IDT electrodes 33a and 33b, and the reflectors 34. In this embodiment, first of all, a layer of aluminum (Al) or aluminum alloy is formed entirely over the piezoelectric substrate 32 by sputtering or vapor deposition.

A resist pattern is then formed to a region for the IDT electrodes 33a and 33b, and the reflectors 34. The resulting region is exposed and developed by photolithography so that any not-masked portions are eliminated by etching. In this manner, formed is an aluminum pattern, i.e., electrode pattern, serving as the IDT electrodes 33a and 33b, and the reflectors 34.

The IDT electrodes 33a and 33b, and the reflectors 34 are formed by a piece of electrode pattern, and as shown in FIG. 14, the piece of electrode pattern is covering over the crystal wafer 70, i.e., the surface on which products are formed. Accordingly, for each of the piezoelectric substrates 32, the electrode pattern is extending to the outer edge thereof. The description is already made by referring to FIG. 13 about the partition sections 35 and the notch sections 37, and thus the same description will not be repeated to avoid redundancy.

A key factor here is that the electrode patterns are formed as a piece on the crystal wafer at the sealing region 36 of the electrode pattern configuring the IDT 33, and the region is used also as the protection layer formation pattern 71.

More in detail, the protection layer formation pattern 71 is regarded as an anode, and any other conductor is used to form a cathode 72. The configuration of FIG. 14 is dipped into water for electrolysis.

In the water, the water is separated into oxygen and hydrogen components through electrolysis, i.e., oxygen comes from the electrode pattern of the IDT 33 serving as an aluminum anode electrode, and hydrogen comes from the cathode 72.

As to the IDT 33, a reaction occurs between aluminum and oxygen so that oxidation is promoted. As a result, the electrode pattern is entirely formed thereon with an oxidation layer for protection purpose. That is, on the crystal wafer 70, the IDT electrodes 33a and 33b for every piezoelectric substrate 32 is formed thereon with such a protection layer all at once with ease.

Note here that the oxidation coating derived by anode oxidation is formed at the bottom with a dielectric active layer. Over such an active layer, formed is a porous layer having a plurality of small holes made in the longitudinal direction, leading to the outer active layer.

To increase the protection performance of the oxide layer, the anode oxidation layer is exposed to water vapor. With this being the case, the molecules of the porous layer expand with water so that the holes are filled. This favorably increases the rust resistance.

Thereafter, if required, metal bumps 73 and 74 are formed to the electrode pattern configuring the IDT electrodes 33a and 33b, i.e., at portions facing the outer edge of the piezoelectric substrate 32, and serving as exposing portions that will be described later. The metal bumps 73 and 74 are preferably gold (Au) bumps. As shown in the partial cross sectional view of FIG. 16, these metal bumps 73 and 74 are formed so as if to break the anode oxide layer serving as a protection layer 33d, which is described in the foregoing. The metal bumps 73 and 74 provided as such both serve well to establish a good electrical connection specifically when the anode oxide layer is not only be excessively rust resistant but also be electrical insulative. The electrical connection is established between the IDT electrodes 33a and 33b, and the external electrodes that will be described later.

b. Cover Preprocessing

Figure 17:
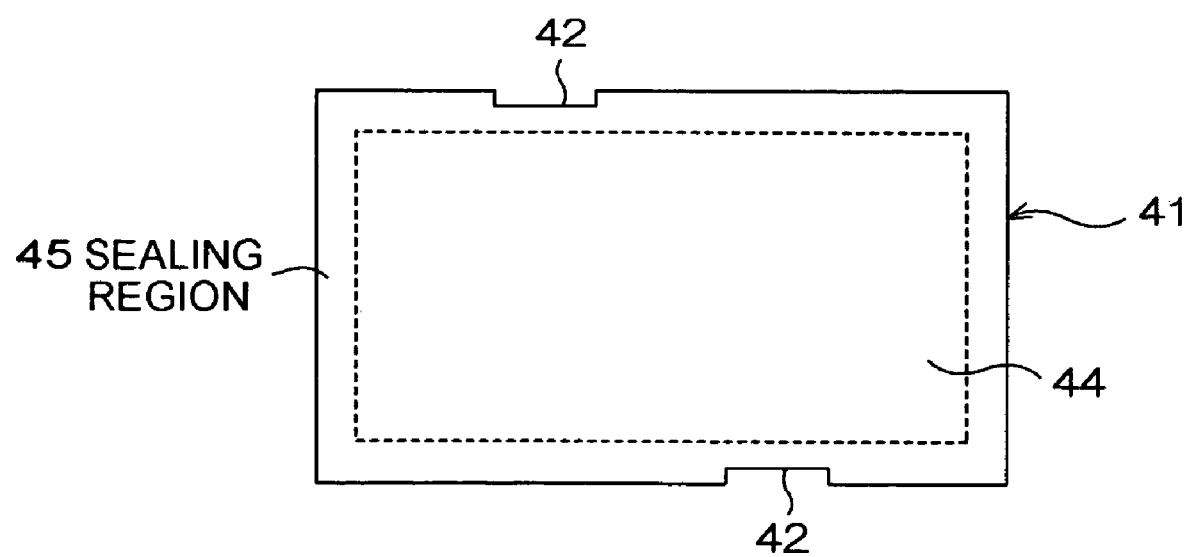
FIG. 17 is still another diagram showing a part of the manufacturing process in the manufacturing method for implementing the SAW device of FIG. 13.

FIG. 17 shows the cover 41. In the present embodiment, a glass-made plate-like member having the same outer shape, i.e., rectangular, as the piezoelectric substrate is formed at the outer edge portion with two concave sections 42. The cover 41 is formed with the sealing region 45 along the outer edge portion, and inside of the sealing region 45, the concave section or cavity 44 is formed. Such cavity formation may be performed in the glass manufacturing process, or the rectangular plate glass may be accordingly cut. The sealing region 45 is formed with an attachment layer on the sealing surface, i.e., surface for attachment with the piezoelectric substrate. The attachment layer can be attached, through anode attachment, with a metal electric pattern formed to the piezoelectric substrate. The attachment layer herein is exemplified by a glass coating of a type attachable with aluminum or aluminum alloy, and is formed by baking or the like. That is, to the sealing region 45, a coating of Pyrex® glass is formed as a glass including moving ions, for example.

c. Sealing

Figure 18:
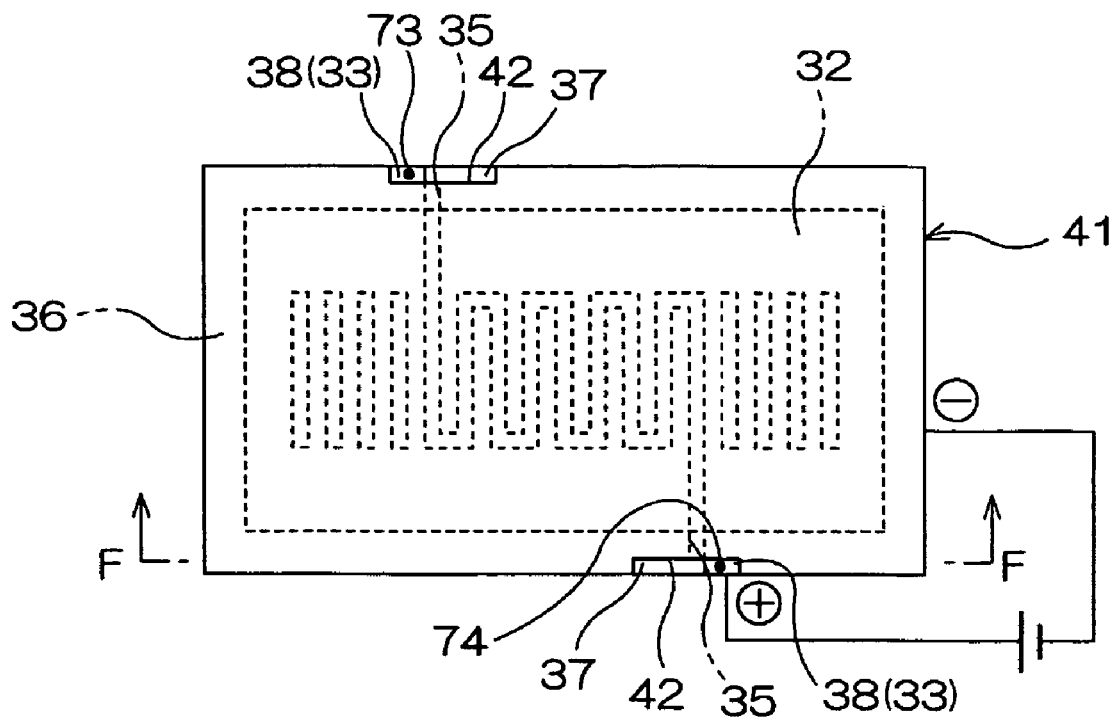
FIG. 18 is still another diagram showing a part of the manufacturing process in the manufacturing method for implementing the SAW device of FIG. 13.
Figure 19:
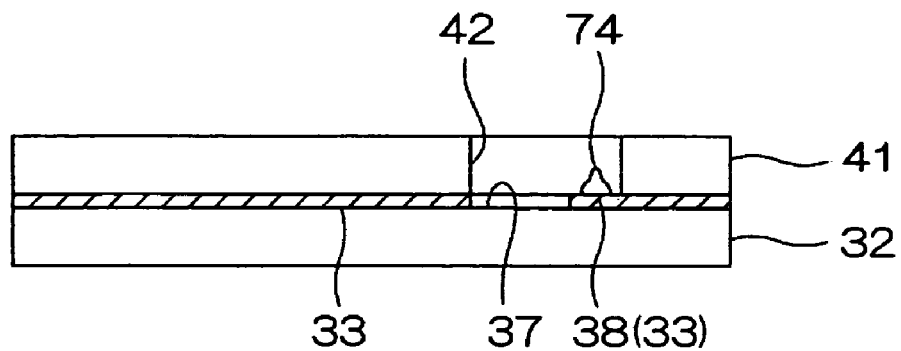
FIG. 19 is a schematic cross sectional view along a line F-F of FIG. 18.

As shown in FIGS. 18 and 19, the piezoelectric substrate 32 is covered with the cover 41. FIG. 19 is a schematic cross sectional view along a line F-F of FIG. 18. The piezoelectric substrate 32 covered with the cover 41 is heated to a specific temperature under nitrogen atmosphere, and then is applied with direct voltage as shown in FIG. 18. Here, the temperature is equal to or lower than a softening point of the Pyrex® glass, and is equal to or lower than a melting point of aluminum. That is, the cover 41 is attached to the piezoelectric substrate 32 through anode attachment. In this state, from the concave portion 42 of the cover 41, an exposing section 38 which is formed with metal bumps 73 and 74 in advance is exposed, i.e., the outer end portions of the IDT 33 extending all the way to the rim of the piezoelectric substrate 32. The portions adjacent to the exposing sections 38 are the notch sections 37 formed with no electrode.

Figure 20:
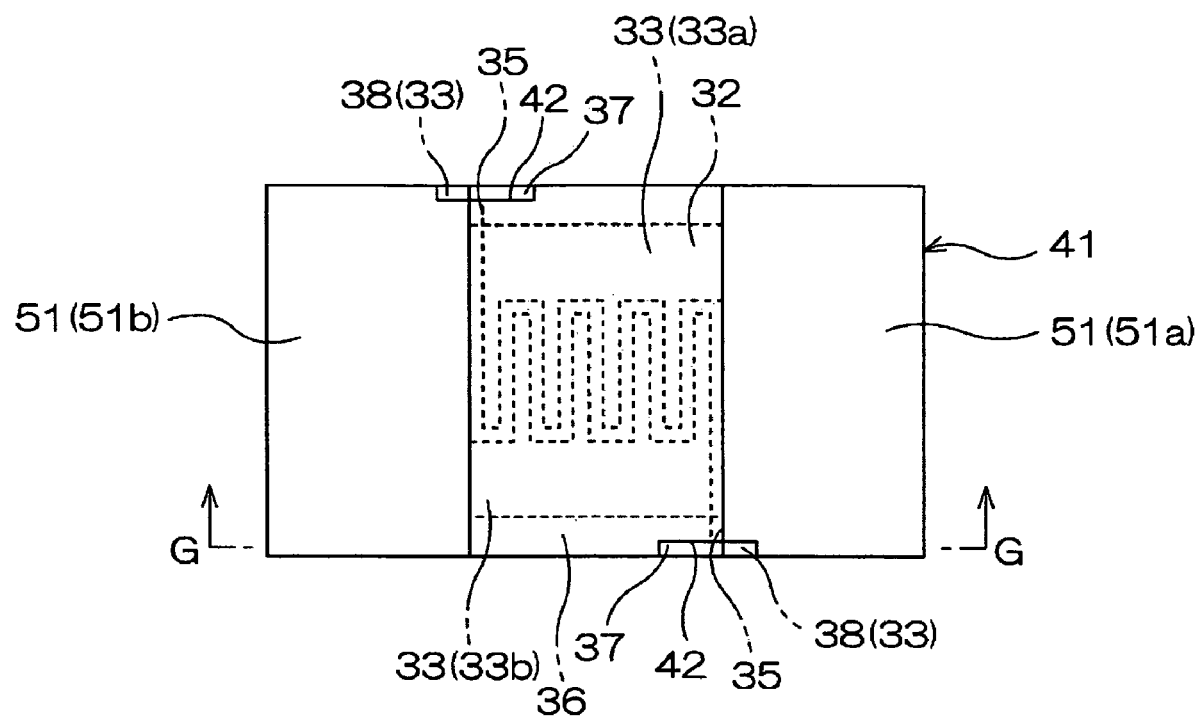
FIG. 20 is still another diagram showing a part of the manufacturing process in the manufacturing method for implementing the SAW device of FIG. 13.
Figure 21:
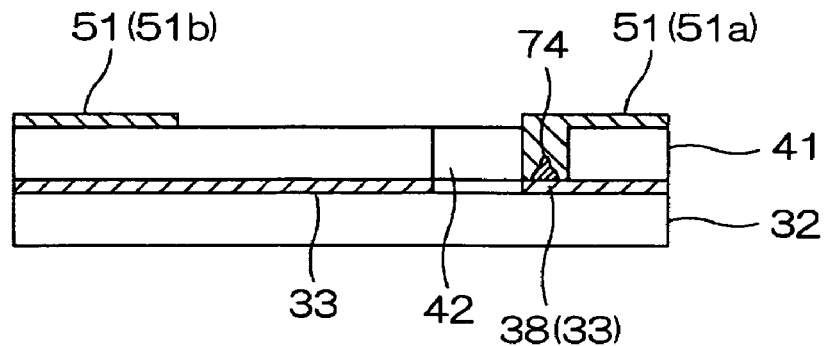
FIG. 21 is a schematic cross sectional view along a line G-G of FIG. 20.

By referring to FIGS. 20 and 21, the external electrodes 51 are formed at both end portions of the cover 41. FIG. 21 is a schematic cross sectional view along a line G-G of FIG. 20. The external electrodes 51 are to be formed by aluminum sputtering or vapor deposition with the cover 41 masked as appropriate.

When such external electrodes 51 are manufactured, as shown in FIG. 20, the metal layer forming the external electrodes 51a is disposed so as to reach down on the corresponding exposing section 38. This is possible because the exposing section 38 is exposed from the concave portion 42 of the cover 41. As shown in FIG. 21, the exposing section 38 is formed with a metal bump 74 in advance, and the metal layer is so attached as to cover the metal bump 74.

That is, the exposing section 38 that is the portion of the IDT 33 extended to the rim of the piezoelectric substrate 32 is utilized as it is as a connection terminal with the external electrode 51a.

With this being the case, the exposing section 38 is formed thereon with the above-described protection layer. Even if this protection layer impairs the continuity of the exposing section 38, the interposition of the metal bump 74 breaking through the protection layer secures the electrical connection between the external electrodes 51 and the IDT 33.

The metal layer of the external electrode 51 connected with the exposing section 38 does not cause a short circuit between electrode patterns even if the layer lies beyond the exposing section 38 to some extent. This is because the adjacent notch section 37 has no electrode pattern.

Figure 22:
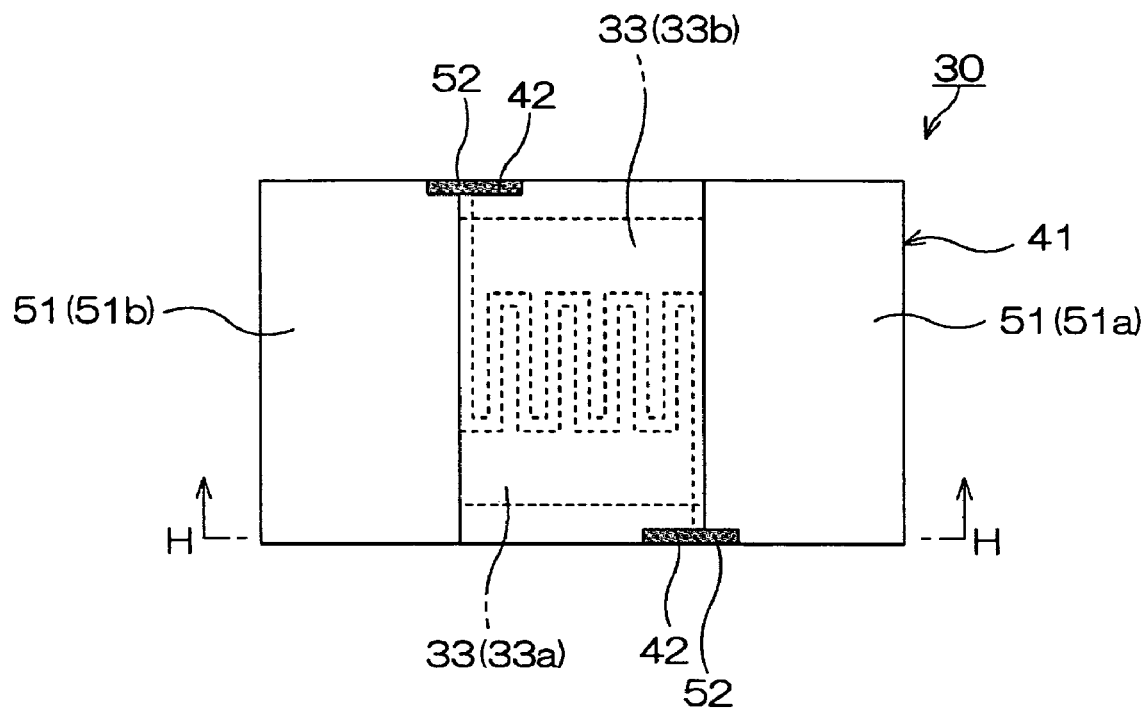
FIG. 22 is still another diagram showing a part of the manufacturing process in the manufacturing method for implementing the SAW device of FIG. 13.
Figure 23:
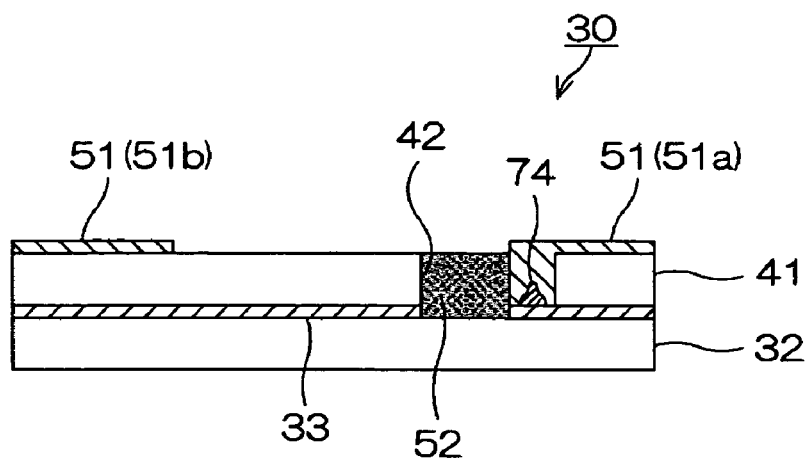
FIG. 23 is a schematic cross sectional view along a line H-H of FIG. 22.

Thereafter, by referring to FIGS. 22 and 23, the concave sections 42 formed in the cover 41 are sealed. FIG. 23 is a schematic cross sectional view along a line H-H of FIG. 22.

The concave sections 42 are filled with the filler 52 of an insulation material, e.g., melted low-melting-point glass. The concave sections 42 are thus sealed airtight without causing a short circuit between electrode patterns.

Figure 24:
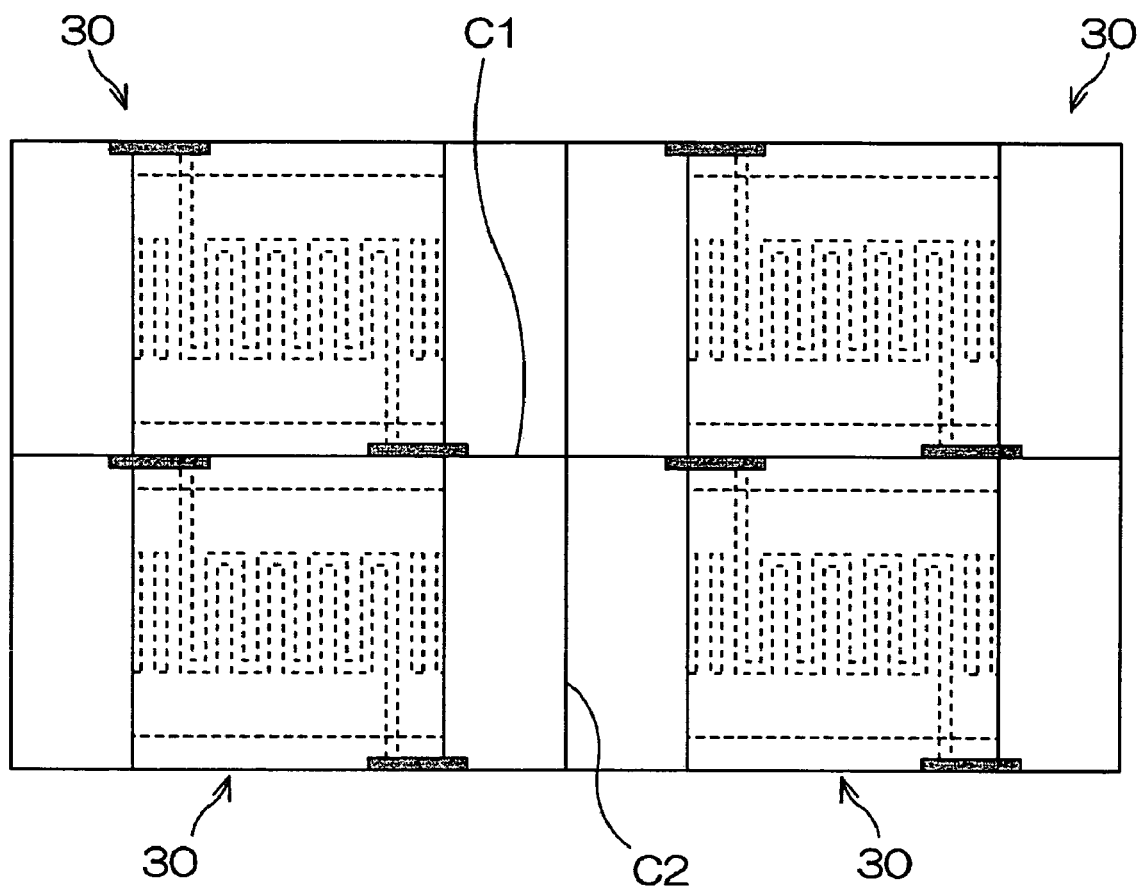
FIG. 24 is still another diagram showing a part of the manufacturing process in the manufacturing method for implementing the SAW device of FIG. 13.

FIG. 24 shows a plurality of SAW devices 30-1 being disposed as a unit, one next to another and one above another. The process is executed with the crystal wafer configuring the piezoelectric substrate being of a piece, i.e., as described above, of a size sufficient for a plurality of or many products.

As a last step, the piezoelectric substrate is diced along cutting liens of C1 and C2 of FIG. 24 so that the SAW devices are separated from one another.

Note here that the filler 52 described by referring to FIGS. 22 and 23 for hole sealing is filled from above the concave sections 42.

Figure 25:
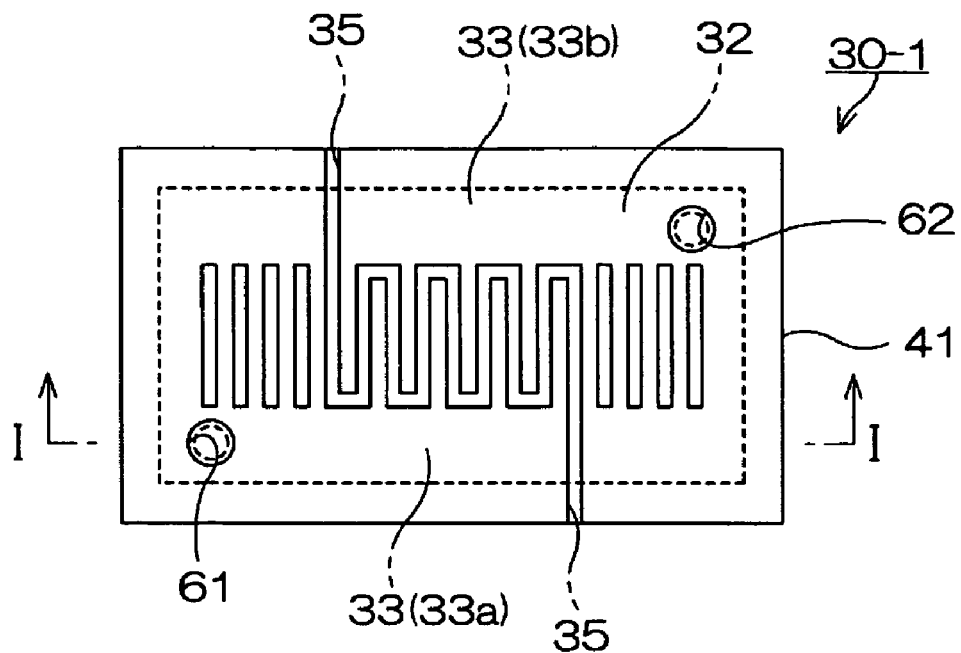
FIG. 25 is a schematic plan view of a SAW device in a third embodiment of the invention.
Figure 26:
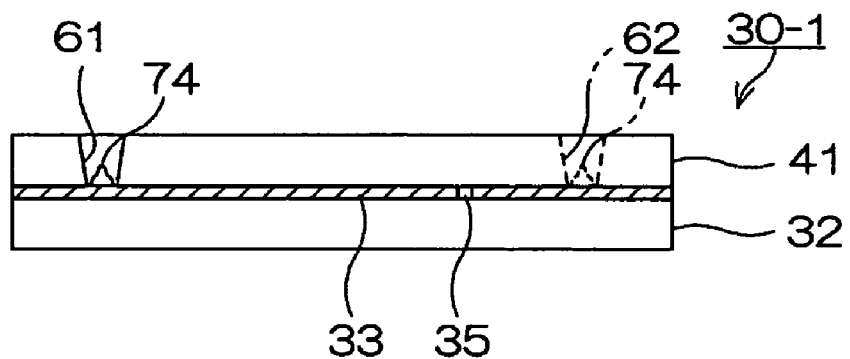
FIG. 26 is a schematic cross sectional view along a line I-I of FIG. 25.

FIGS. 25 and 26 are both diagrams for a third embodiment of a SAW device. Specifically, FIG. 25 is a schematic plan view of a SAW device 30-1, and FIG. 26 is a schematic cross sectional view along a line I-I of FIG. 25.

In FIGS. 25 and 26, any component identical to that in the second embodiment is provided with the same reference numeral, and only differences from the second embodiments are described below to avoid redundancy.

Similarly to the second embodiment, the cover 41 is formed with no concave section. Alternatively, the cover 41 herein is formed with the through holes 61 and 62 at portions corresponding to the electrode finger patterns 33a and 33b, respectively. The electrode finger patterns 33a and 33b form an electrode pair for the IDT 33 of the piezoelectric substrate 32. The through holes 61 and 62 are also each formed at a position corresponding to its corresponding external electrode. The external electrodes herein are formed at the same position as the external electrodes 51a and 51b of the second embodiment, but not shown here. From the bottoms of the through holes 61 and 62, the electrode pattern of the IDT 33 is exposed, and the portion serves as an electrode exposing section.

The through holes 61 and 62 thus establish an electrical connection between the external electrodes and the IDT 33.

The third embodiment has advantages of achieving size reduction as does the second embodiment, and of forming the through holes 61 and 62 at any arbitrary positions as long as not on the partition sections 35, and as long as on the positions corresponding to the electrode finger patterns 33a and 33b. Another advantage is that hole sealing is not needed.

The invention is not restrictive to the above-described embodiments, and the components of the embodiments can be omitted as appropriate or combined with any other components not shown.

The reflectors are provided in the above embodiments, but this is not required. The piezoelectric substrate and the cover are both not necessarily rectangular, but may take any shape. Glass is not the only material option for the cover, and any other material will do as long as it is insulative, and allows anode attachment with metal portions of the IDT electrodes.

What is claimed is:

1. A surface acoustic wave device in which a cover seals over a surface acoustic wave chip having a piezoelectric substrate formed thereon with an inter-digital transducer, wherein
   the inter-digital transducer is extended to a rim of the piezoelectric substrate,
   a partition section is provided to the rim of the piezoelectric substrate to partition an electrode pattern to derive two of the inter-digital transducers,
   a sealing region is provided for anode attachment along an outer edge of a sealing surface of the cover, and
   a concave section is formed in the outer edge of the cover for sealing at a position corresponding to the partition section on the piezoelectric substrate.

2. The surface acoustic wave device according to claim 1, wherein
   the sealing region of the cover is formed with glass for anode attachment.

3. The surface acoustic wave device according to claim 1, wherein
   with the cover attached to the piezoelectric substrate, the electrode pattern on the piezoelectric substrate is partially exposed by the concave section.

4. The surface acoustic wave device according to claim 3, wherein
   the sealing surface of the cover is entirely formed with glass for anode attachment except a region formed on the piezoelectric substrate with the inter-digital transducer.

5. A surface acoustic wave device in which a cover seals over a surface acoustic wave chip having a piezoelectric substrate formed thereon with an inter-digital transducer, wherein
   the inter-digital transducer is extended to a rim of the piezoelectric substrate,
   a partition section is provided to the rim of the piezoelectric substrate to partition an electrode pattern to derive two of the inter-digital transducers,
   a sealing region is provided for anode attachment along an outer edge of a sealing surface of the cover, and
   a through hole is formed in the cover at a position corresponding to the partition section on the piezoelectric substrate, the through hole being conductive for establishing an electrical connection with an external electrode formed on a surface side.

6. A surface acoustic wave device in which a cover seals over a surface acoustic wave chip having a piezoelectric substrate formed thereon with an inter-digital transducer, wherein
   the inter-digital transducer is extended to a rim of the piezoelectric substrate, and a protection layer formation pattern being at least a part of a resulting extended electrode pattern is formed,
   a partition section is provided to the rim of the piezoelectric substrate to partition the electrode pattern to derive two of the inter-digital transducers,
   a sealing region is provided for anode attachment along an outer edge of a sealing surface of the cover, and
   a concave section is formed in the outer edge of the cover for sealing at a position corresponding to the partition section on the piezoelectric substrate.

7. The surface acoustic wave device according to claim 6, wherein
   on a protection layer formed to the electrode pattern on the inter-digital transducer, a metal bump is formed in the protection layer, and through the metal bump, a connection is established with an external electrode formed outside of the device.

8. The surface acoustic wave device according to claim 6, wherein an exposing section is provided by not forming the protection layer to a part of the extended electrode pattern, and the exposing section is connected with an external electrode formed outside of the device.

9. A surface acoustic wave device in which a cover seals over a surface acoustic wave chip having a piezoelectric substrate formed thereon with an inter-digital transducer, wherein the inter-digital transducer is extended to a rim of the piezoelectric substrate, and a protection layer formation pattern being at least a part of a resulting extended electrode pattern is formed, a partition section is provided to the rim of the piezoelectric substrate to partition the electrode pattern to derive two of the inter-digital transducers, a sealing region is provided for anode attachment along an outer edge of a sealing surface of the cover, and on the protection layer of the electrode pattern exposed from a through hole that is previously formed in the cover, the metal bump is formed in the protection layer.

* * * * *